United States Patent
Kim et al.

(10) Patent No.: US 12,364,007 B2
(45) Date of Patent: Jul. 15, 2025

(54) INTEGRATED CIRCUIT DEVICE INCLUDING INSULATING GUIDE FILM BETWEEN ADJACENT CONDUCTIVE PATTERNS

(71) Applicant: Samsung Electronics Co., Ltd., Suwon-si (KR)

(72) Inventors: Yeonggil Kim, Hwaseong-si (KR); Seonbae Kim, Hwaseong-si (KR); Woojin Lee, Hwaseong-si (KR); Jayeong Heo, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 452 days.

(21) Appl. No.: 17/828,327

(22) Filed: May 31, 2022

(65) Prior Publication Data

US 2023/0129825 A1    Apr. 27, 2023

(30) Foreign Application Priority Data

Oct. 27, 2021    (KR) .......................... 10-2021-0144973

(51) Int. Cl.
*H01L 21/28*    (2025.01)
*H10D 84/90*    (2025.01)

(52) U.S. Cl.
CPC .......... *H10D 84/907* (2025.01); *H10D 84/975* (2025.01)

(58) Field of Classification Search
CPC .......... H01L 21/76897; H01L 29/66545; H01L 29/6656; H01L 29/66553
See application file for complete search history.

(56) References Cited

U.S. PATENT DOCUMENTS

| 9,698,232 | B2 * | 7/2017 | Yang ................... H01L 29/4966 |
| 10,256,296 | B2 | 4/2019 | Ok et al. |
| 10,418,453 | B2 | 9/2019 | Wang et al. |
| 10,566,433 | B2 | 2/2020 | Yim et al. |

(Continued)

FOREIGN PATENT DOCUMENTS

| KR | 10-2019-0059665 A | 5/2019 |
| KR | 10-2020-0086899 A | 7/2020 |

OTHER PUBLICATIONS

Korean Office Action dated Jun. 4, 2025 issued in Korean Patent Application No. 10-2021-0144973.

*Primary Examiner* — Eric A. Ward
(74) *Attorney, Agent, or Firm* — Harness, Dickey & Pierce, P.L.C.

(57) ABSTRACT

An integrated circuit (IC) device including a fin-type active region on a substrate and a gate line on the fin-type active and having a first uppermost surface at a first vertical level, an insulating spacer covering a sidewall of the gate line and having a second uppermost surface at the first vertical level, and an insulating guide film covering the second uppermost surface of the insulating spacer may be provided. The gate line may include a multilayered conductive film structure that includes a plurality of conductive patterns and have a top surface defined by the conductive patterns, which includes at least first and second conductive patterns including different materials from each other and a unified conductive pattern that is in contact with a top surface of each of the conductive patterns and has a top surface that defines the first uppermost surface.

19 Claims, 46 Drawing Sheets

(56) References Cited

U.S. PATENT DOCUMENTS

| | | |
|---|---|---|
| 10,770,288 B2 | 9/2020 | Chi et al. |
| 10,790,363 B2 | 9/2020 | Economikos et al. |
| 10,804,145 B2 | 10/2020 | Kim et al. |
| 10,868,184 B2 | 12/2020 | Chiang et al. |
| 11,004,750 B2 | 5/2021 | Xie et al. |
| 2016/0284641 A1* | 9/2016 | Liou .................... H01L 23/5226 |
| 2017/0040449 A1* | 2/2017 | Asenov ............. H01L 29/41775 |
| 2020/0044074 A1* | 2/2020 | Liang ................ H01L 29/66795 |
| 2020/0105577 A1* | 4/2020 | Liang ................ H01L 21/76843 |
| 2020/0243385 A1* | 7/2020 | Huang ................ H01L 21/0217 |
| 2022/0102202 A1* | 3/2022 | Hsiung ............. H01L 21/76829 |

\* cited by examiner

X9 - X9'

X1 – X1'

X1 – X1'

X1 – X1'

INTEGRATED CIRCUIT DEVICE INCLUDING INSULATING GUIDE FILM BETWEEN ADJACENT CONDUCTIVE PATTERNS

CROSS-REFERENCE TO RELATED APPLICATION

This application is based on and claims priority under 35 U.S.C. § 119 to Korean Patent Application No. 10-2021-0144973, filed on Oct. 27, 2021, in the Korean Intellectual Property Office, the disclosure of which is incorporated by reference herein in its entirety.

BACKGROUND

The inventive concepts relate to integrated circuit (IC) devices, and more particularly, to IC devices including a fin field-effect transistor (FinFET).

As the downscaling of IC devices has progressed rapidly, IC devices need to obtain not only a fast operation speed but also operation accuracy. Accordingly, it is necessary to develop technology for IC devices that may obtain stable insulation distances between wirings and contacts, while reducing areas occupied by the wirings and the contacts within relatively small areas, and exhibit improved reliability.

SUMMARY

The inventive concepts provide integrated circuit (IC) devices, each of which includes a device region, an area of which is reduced with the downscaling of IC devices, and has a structure capable of improving reliability.

According to an aspect of the inventive concepts, an IC device may include a fin-type active region extending on a substrate in a first direction, a gate line extending on the fin-type active region in a second direction, the gate line having a first uppermost surface at a first vertical level, the second direction intersecting with the first direction, an insulating spacer covering a sidewall of the gate line and having a second uppermost surface at the first vertical level, an insulating guide film includes a first portion covering the second uppermost surface of the insulating spacer. The gate line may include a multilayered conductive film structure and a unified conductive pattern. The multilayered conductive film structure may include a plurality of conductive patterns and have a top surface defined by the plurality of conductive patterns, the plurality of conductive patterns including at least a first conductive pattern including a first material and a second conductive pattern including a second material different from the first material. The unified conductive pattern may be in contact with a top surface of each of the plurality of conductive patterns in the multilayered conductive film structure and has a top surface that defines the first uppermost surface of the gate line.

According to another aspect of the inventive concepts, an IC device may include a fin-type active region extending on a substrate in a first direction, a plurality of gate lines extending on the fin-type active region in a second direction, each of the plurality of gate lines having a first uppermost surface at a first vertical level, the second direction intersecting with the first direction, a plurality of insulating spacers covering both sidewalls of each of the plurality of gate lines, respectively, each of the plurality of insulating spacers having a second uppermost surface at the first vertical level, a plurality of source/drain regions on the fin-type active region, the plurality of source/drain regions are arranged one by one between adjacent pairs of the plurality of gate lines respectively, a source/drain contact pattern connected to a selected one of the plurality of source/drain regions, the source/drain contact pattern having a third uppermost surface at the first vertical level, an insulating guide film covers the second uppermost surface of each of the plurality of insulating spacers. Each of the plurality of gate lines includes a multilayered conductive film and a unified conductive pattern. The multilayered conductive film structure may include a plurality of conductive patterns and have a top surface defined by the plurality of conductive patterns, at least one of the plurality of conductive patterns including a different material from at least one of the plurality of conductive patterns. The unified conductive pattern may be in contact with a top surface of each of the plurality of conductive patterns in the multilayered conductive film structure, the unified conductive pattern having a top surface that defines the first uppermost surface.

According to another aspect of the inventive concepts, an IC device may include a fin-type active region extending on a substrate in a first direction, a gate line extending on the fin-type active region in a second direction, the gate line including a multilayered conductive film structure and a unified conductive pattern, the multilayered conductive film structure including a plurality of conductive patterns, the plurality of conductive patterns including at least two conductive patterns, the at least two conductive patterns including k different materials, respectively, the unified conductive pattern being in contact with a top surface of each of the plurality of conductive patterns, The second direction intersecting with the first direction, an insulating spacer covering a sidewall of the gate line, a source/drain region adjacent to the gate line on the fin-type active region, a metal silicide film covering the source/drain region, a source/drain contact pattern connected to the source/drain region through the metal silicide film, the source/drain contact pattern being apart from the gate line in the first direction with the insulating spacer therebetween, and an insulating guide film covering a top surface of the insulating spacer. Each of a first uppermost surface of the unified conductive pattern, a second uppermost surface of the insulating spacer, and a third uppermost surface of the source/drain contact pattern may extend parallel to a main surface of the substrate at a first vertical level on the substrate. The unified conductive pattern may include a same material as the source/drain contact pattern.

BRIEF DESCRIPTION OF THE DRAWINGS

Some example embodiments of the inventive concepts will be more clearly understood from the following detailed description taken in conjunction with the accompanying drawings in which:

FIGS. 11A to 25B are cross-sectional views of a process sequence of a method of manufacturing an IC device, according to some example embodiments, wherein FIGS. 11A, 12A, 13 to 19, 20A, 21 to 23, 24A, and 25A are cross-sectional views of a portion corresponding to the cross-section taken along line X1-X1' of FIG. 2, according to the process sequence, and FIGS. 11B, 12B, 20B, 24B, and 25B are cross-sectional views of a portion corresponding to the cross-section taken along line Y1-Y1' of FIG. 2, according to the process sequence;

DETAILED DESCRIPTION

Figure 1:
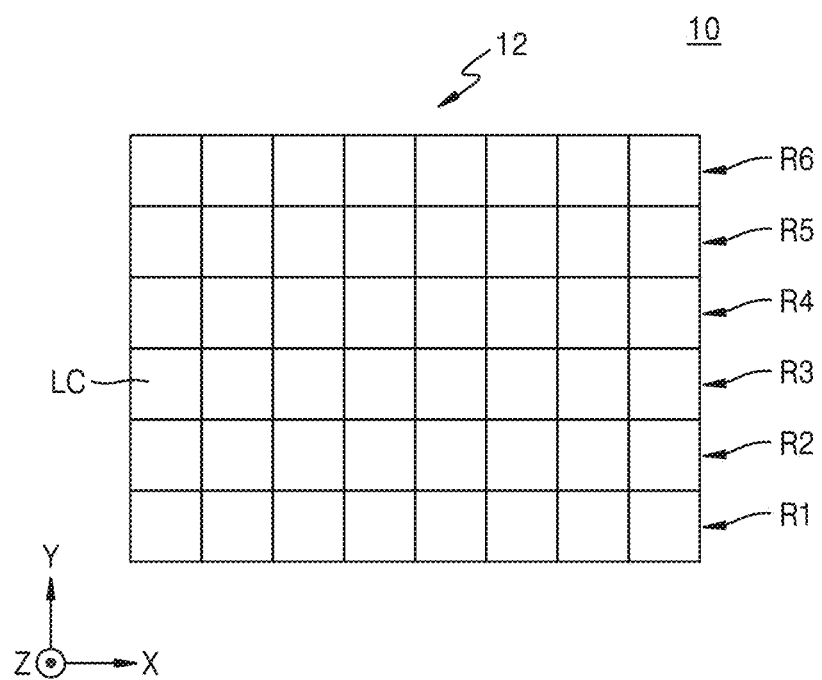
FIG. 1 illustrates a plan layout of an example cell block of an integrated circuit (IC) device according to some example embodiments.

Hereinafter, some example embodiments will be described in detail with reference to the accompanying drawings. The same reference numerals are used to denote the same elements in the drawings, and repeated descriptions thereof will be omitted.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

FIG. 1 is a plan layout diagram of a cell block 12 of an integrated circuit (IC) device 10, according to some example embodiments.

Referring to FIG. 1, the cell block 12 of the IC device 10 may include a plurality of logic cells LC, which include circuit patterns configured to constitute various circuits. The plurality of logic cells LC may be arranged in a matrix form in a first direction (X direction) and a second direction (Y direction). In FIG. 1, the first direction (X direction) may be referred to as a width direction, and the second direction (Y direction) may be referred to as a height direction.

Each of the plurality of logic cells LC may include circuits configured to perform at least one logic function. In some example embodiments, the plurality of logic cells LC may include a plurality of standard cells. In some example embodiments, at least some of the plurality of logic cells LC may perform the same logic function. In other example embodiments, at least some of the plurality of logic cells LC may perform different logic functions.

The plurality of logic cells LC may include various kinds of logic cells including a plurality of circuit elements. For example, each of the plurality of logic cells LC may include AND, NAND, OR, NOR, exclusive OR (XOR), exclusive NOR (XNOR), an inverter (INV), an adder (ADD), a buffer (BUF), a delay (DLY), a filter (FIL), a multiplexer (MXT/MXIT), OR/AND/INVERTER (OAI), AND/OR (AO), AND/OR/INVERTER (AOI), a D-flip-flop, a reset flip-flop, a master-slaver flip-flop, a latch, or a combination thereof, without being limited thereto.

The cell block 12 may include a plurality of rows R1, R2, . . . , and R6, which include the plurality of logic cells LC. In one row (e.g., the row R1) selected from the plurality of rows R1, R2, . . . , and R6, at least some of the plurality of logic cells LC, which are arranged in a line in the first direction (X direction), may have the same width. Further, the plurality of logic cells LC, which form one row, may have the same height. However, the inventive concepts are not limited to that shown in FIG. 1. At least some of the plurality of logic cells LC, which form one row, may have different widths and heights.

In some example embodiments, from among the plurality of logic cells LC, which are in one row, two adjacent cells adjacent to each other in the width direction, may be apart from each other with a fin isolation region therebetween. In other example embodiments, the fin isolation region between the plurality of logic cells LC may be omitted.

Although the cell block 12 including six rows R1, R2, . . . , and R6 is illustrated in FIG. 1, the inventive concepts are not limited thereto. The cell block 12 may include various numbers of rows selected as needed, and one row may include various numbers of logic cells LC selected as needed.

Figure 2:
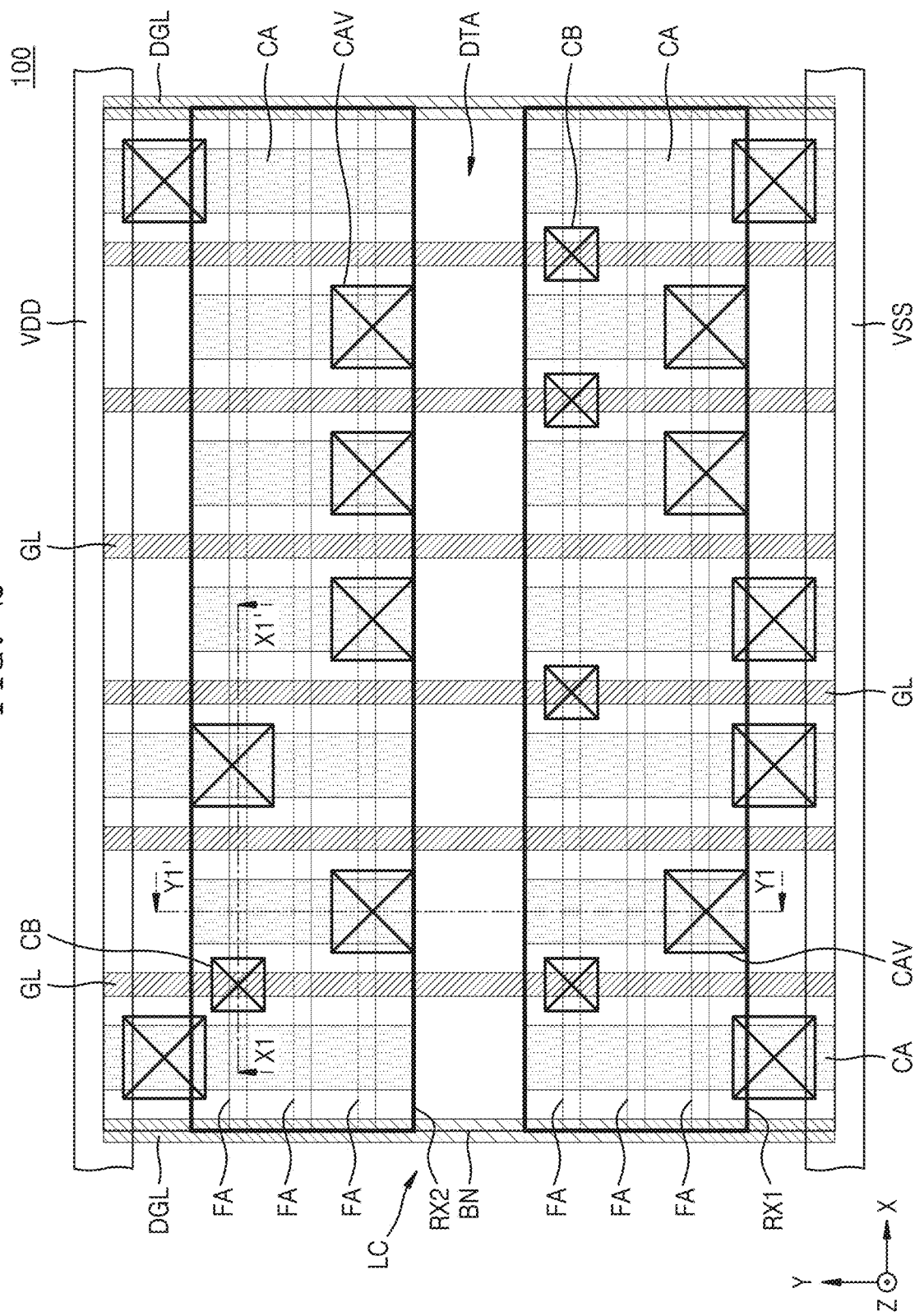
FIG. 2 is a plan layout diagram of an IC device according to some example embodiments.
Figure 3A:
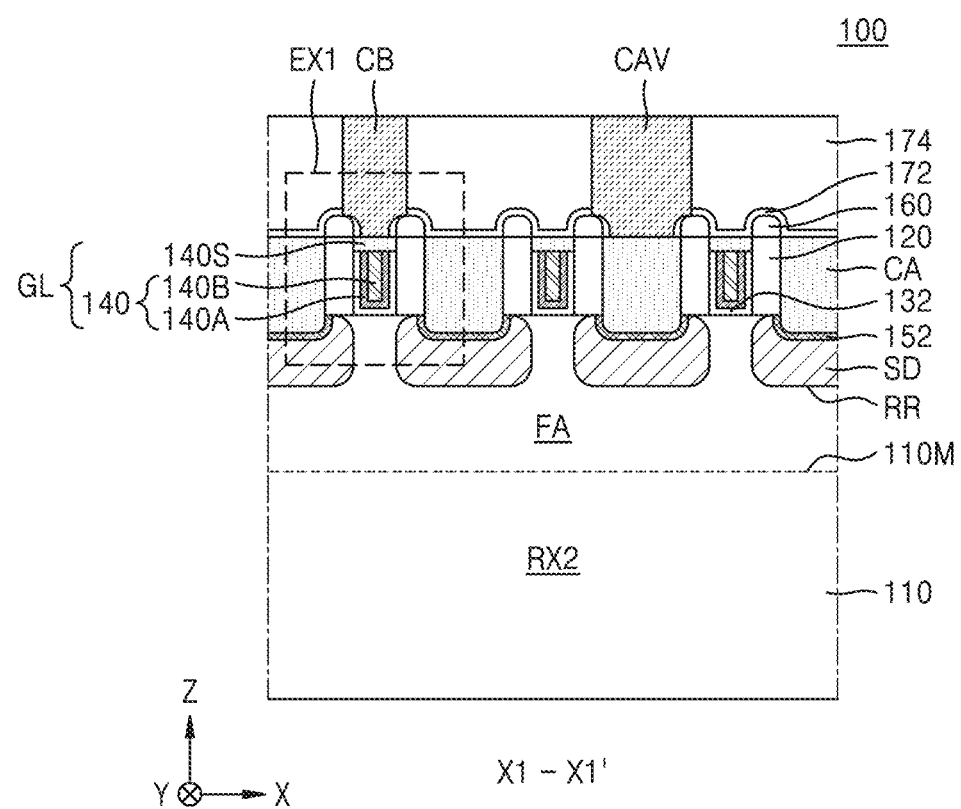
FIG. 3A is a cross-sectional view of some components corresponding to a cross-section taken along line X1-X1' of FIG. 2.
Figure 3B:
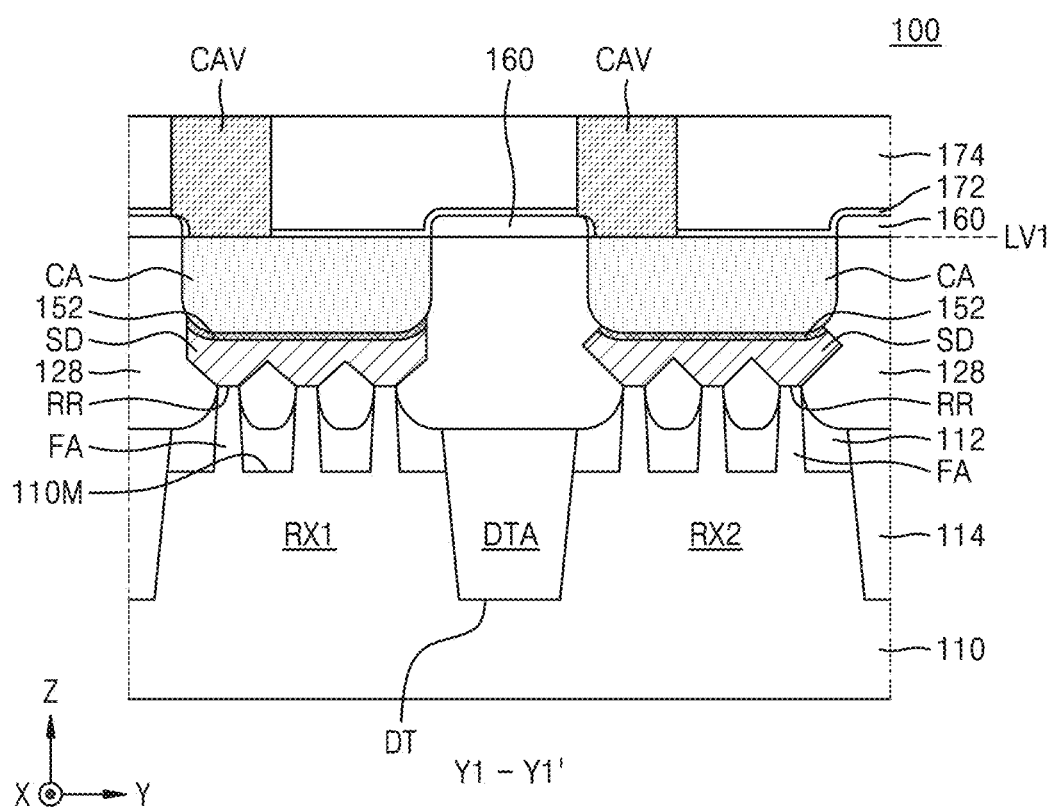
FIG. 3B is a cross-sectional view of some components corresponding to a cross-section taken along line Y1-Y1' of FIG. 2.
Figure 3C:
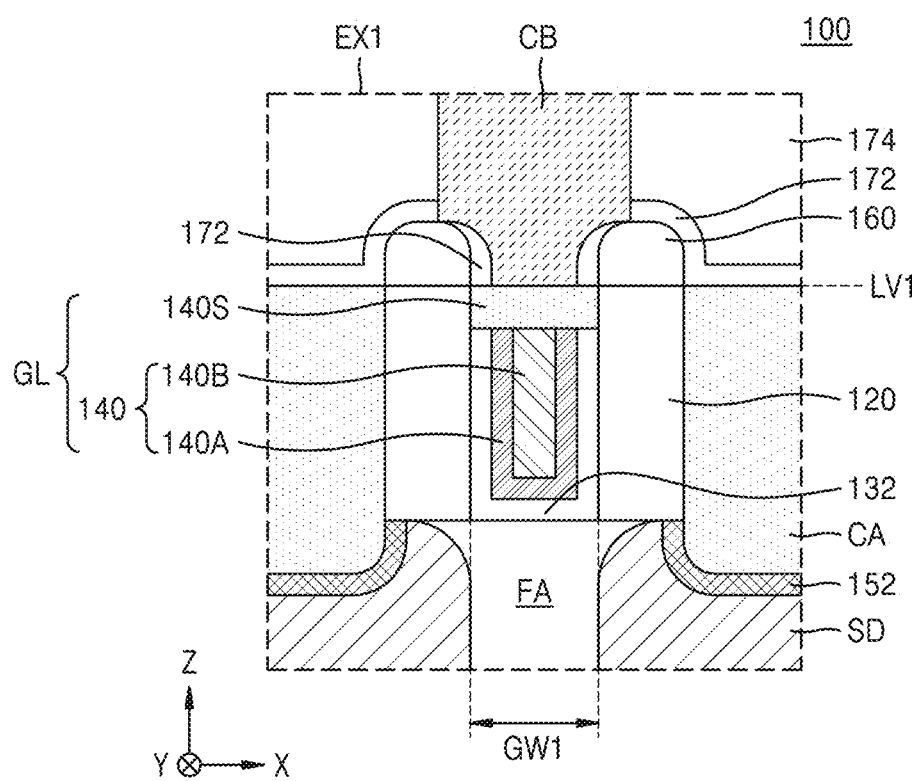
FIG. 3C is an enlarged cross-sectional view of region "EX1" of FIG. 3A.

FIG. 2 is a plan layout diagram of an IC device 100 according to some example embodiments. FIG. 3A is a cross-sectional view of some components corresponding to a cross-section taken along line X1-X1' of FIG. 2. FIG. 3B is a cross-sectional view of some components corresponding to a cross-section taken along line Y1-Y1' of FIG. 2. FIG. 3C is an enlarged cross-sectional view of region "EX1" of FIG. 3A.

Referring to FIGS. 2 and 3A to 3C, the IC device 100 may include a logic cell LC formed in a region defined by a cell boundary BN on a substrate 110. The logic cell LC shown in FIG. 2 may constitute a portion of the cell block 12 described with reference to FIG. 1. The IC device 100 may include a fin field effect transistor (FinFET) device.

The substrate 110 may have a main surface 110M, which extends in a planar direction (e.g., an X-Y plane direction). The substrate 110 may include an element semiconductor, such as silicon (Si) or germanium (Ge), or a compound semiconductor (e.g., silicon germanium (SiGe), silicon carbide (SiC), gallium arsenide (GaAs), indium arsenide (InAs), or indium phosphide (InP)). The substrate 110 may include a conductive region, for example, a doped well or a doped structure.

The logic cell LC may include a first device region RX1 and a second device region RX2. A plurality of fin-type active regions FA may be formed in each of the first device region RX1 and the second device region RX2 and protrude from the substrate 110. An inter-device isolation region DTA may be between the first device region RX1 and the second device region RX2.

A plurality of fin-type active regions FA may extend parallel to each other in a width direction of the logic cell LC, that is, a first direction (X direction). As shown in FIG. 3B, on the substrate 110, a device isolation film 112 may be formed between the plurality of fin-type active regions FA, and an inter-device isolation insulating film 114 may be formed in the inter-device isolation region DTA. Each of the device isolation film 112 and the inter-device isolation insulating film 114 may include a silicon oxide film. In the first device region RX1 and the second device region RX2, each of the plurality of fin-type active regions FA may protrude as a fin type over the device isolation film 112.

As shown in FIG. 3A, on the substrate 110, a plurality of gate insulating films 132 and a plurality of gate lines GL may extend in a height direction of the logic cell LC (e.g., a second direction (Y direction)), which is a direction intersecting with the plurality of fin-type active regions FA. The plurality of gate insulating films 132 and the plurality of gate lines GL may cover a top surface and both sidewalls of each of the plurality of fin-type active regions FA, a top surface of the device isolation film 112, and a top surface of the inter-device isolation insulating film 114.

Each of the plurality of gate lines GL may include a multilayered conductive film structure 140 and a unified conductive pattern 140S. The multilayered conductive film structure 140 has a top surface formed by a plurality of conductive patterns including at least two kinds of different materials (e.g., at least a first conductive pattern including a first material and a second conductive pattern including a second material different from the first material). In other words, at least one of the plurality of conductive patterns may include a different material from another one of the plurality of conductive patterns. The unified conductive pattern 140S covers the top surface of the multilayered conductive film structure 140. The multilayered conductive film structure 140 may include a first metal-containing film (e.g., the first conductive pattern) 140A and a second metal-containing film (e.g., the second conductive pattern) 140B that are sequentially stacked on the fin-type active region FA and include different materials, respectively. An uppermost surface of each of the first metal-containing film 140A and the second metal-containing film 140B may be in contact with a bottom surface of the unified conductive pattern 140S. In some example embodiments, the first metal-containing film 140A in the multilayered conductive film structure 140 may be in contact with the gate insulating film 132.

In some example embodiments, in the multilayered conductive film structure 140, the first metal-containing film 140A may have a different thickness from the second metal-containing film 140B. In some example embodiments, the first metal-containing film 140A and the second metal-containing film 140B may include different films, each of which is selected from titanium nitride (TiN), tantalum nitride (TaN), titanium aluminium carbide (TiAlC), titanium aluminium nitride (TiAlN), titanium silicon nitride (TiNSi), tantalum silicon nitride (TaNSi), and a combination thereof. However, a constituent material of each of the first metal-containing film 140A and the second metal-containing film 140B is not limited to the examples described above.

The unified conductive pattern 140S may have the bottom surface in contact with a top surface of each of the first metal-containing film 140A and the second metal-containing film 140B of the multilayered conductive film structure 140. In some example embodiments, the unified conductive pattern 140S may include a unified material having a uniform composition over the entire areas of the unified conductive pattern 140S. For example, the unified conductive pattern 140S may include a metal film including one metal selected from titanium (Ti), tantalum (Ta), tungsten (W), ruthenium (Ru), aluminium (Al), niobium (Nb), molybdenum (Mo), hafnium (Hf), nickel (Ni), cobalt (Co), platinum (Pt), copper (Cu), ytterbium (Yb), terbium (Tb), dysprosium (Dy), erbium (Er), and palladium (Pd).

An uppermost surface of the unified conductive pattern 140S may correspond to an uppermost surface of the gate line GL. The uppermost surface of the gate line GL may extend parallel to a main surface 110M of the substrate 110 at a first vertical level LV1 on the substrate 110.

A plurality of metal oxide semiconductor (MOS) transistors may be formed along the plurality of gate lines GL in the first device region RX1 and the second device region RX2. Each of the plurality of MOS transistors may include a three-dimensional (3D) MOS transistor of which a channel is formed on a top surface and both sidewalls of the fin-type active regions FA. Although only a sectional configuration of the plurality of gate lines GL in the second device region RX2 is illustrated in FIG. 3A, a sectional configuration of the plurality of gate lines GL in the first device region RX1 may have substantially the same configuration as that described with reference to FIG. 3A. However, respective constituent materials and thicknesses of the first metal-containing film 140A and the second metal-containing film 140B, which are in the plurality of gate lines GL, may be different in the first device region RX1 and the second device region RX2.

A dummy gate line DGL may extend along a cell boundary BN, which extends in the second direction (Y direction). The dummy gate line DGL may include the same material as the plurality of gate lines GL. During an operation of the IC device 100, the dummy gate line DGL may remain electrically floated and serve as an electrical isolation region between the logic cell LC and other logic cells adjacent thereto. The plurality of gate lines GL and a plurality of dummy gate lines DGL may have the same width in the first direction (X direction) and be arranged at a constant pitch in the first direction (X direction).

Each of the plurality of gate insulating films 132 may include a silicon oxide film, a high-k dielectric film, or a combination thereof. The high-k dielectric film may include a material having a higher dielectric constant than a silicon oxide film. The high-k dielectric film may include a metal oxide or a metal oxynitride. An interface film (not shown) may be between the fin-type active region FA and the gate insulating film 132. The interface film may include an oxide film, a nitride film, or an oxynitride film.

As shown in FIGS. 3A and 3C, a plurality of insulating spacers 120 may cover both sidewalls of the plurality of gate lines GL, respectively, and both sidewalls of the plurality of dummy gate lines DGL, respectively. Each of a plurality of insulating spacers 120 may extend in a line shape in the second direction (Y direction). The plurality of insulating spacers 120 may each include a silicon nitride film, a silicon oxycarbonitride (SiOCN) film, a silicon carbonitride (SiCN) film, or a combination thereof, without being limited thereto.

Each of the plurality of insulating spacers 120 may be laterally apart from the multilayered conductive film structure 140 of the gate line GL with the gate insulating film 132 therebetween. An upper portion of each of the plurality of insulating spacers 120, which is relatively far from the substrate 1100, may be in contact with a sidewall of the unified conductive pattern 140S of the gate line GL. Each of the plurality of insulating spacers 120 may have an uppermost surface at the first vertical level LV1.

As shown in FIGS. 3A and 3B, a plurality of recess regions RR may be formed on both sides of the gate lines GL, respectively, in the top surfaces of the plurality of fin-type active regions FA, and a plurality of source/drain regions SD may be formed inside the plurality of recess regions RR. The gate line GL may be apart from the source/drain region SD with the gate insulating film 132 therebetween. The plurality of source/drain regions SD may include a semiconductor epitaxial layer, which is epitaxially grown from the plurality of recess regions RR formed in the fin-type active region FA. For example, the plurality of source/drain regions SD may include an epitaxially grown silicon (Si) layer, an epitaxially grown silicon carbide (SiC) layer, or a plurality of epitaxially grown silicon germanium (SiGe) layers.

As shown in FIG. 3B, the plurality of source/drain regions SD, the device isolation film 112, and an inter-device isolation insulating film 114 may be covered by an inter-gate dielectric film 128. An uppermost surface of the inter-gate dielectric film 128 may extend parallel to the main surface 110M of the substrate 110 at the first vertical level LV1. The inter-gate dielectric film 128 may include a silicon oxide film. In some example embodiments, an insulating liner (not shown) may be between the plurality of source/drain regions SD and the inter-gate dielectric film 128. The insulating liner may conformally cover a surface of each of the plurality of source/drain regions SD. The insulating liner may include silicon nitride (SiN), silicon carbonitride (SiCN), silicon boron nitride (SiBN), silicon oxynitride (SiON), silicon oxycarbonitride (SiOCN), silicon boron carbonitride (SiBCN), silicon oxycarbide (SiOC), silicon dioxide (SiO$_2$), or a combination thereof.

In some example embodiments, the first device region RX1 may be an NMOS transistor region, and the second device region RX2 may be a PMOS transistor region. In this case, the plurality of source/drain regions SD in the first device region RX1 may include an epitaxially grown Si layer or an epitaxially grown SiC layer, and the plurality of source/drain regions SD in the second device region RX2 may include a plurality of epitaxially grown SiGe layers. As shown in FIG. 3B, the plurality of source/drain regions SD in the first device region RX1 may have a different shape and size from the plurality of source/drain regions SD in the second device region RX2. However, the inventive concepts are not limited to the example shown in FIG. 3B, and a plurality of source/drain regions SD having various shapes and sizes may be formed in the first device region RX1 and the second device region RX2.

A plurality of source/drain contact patterns CA may be on the plurality of source/drain regions SD. The plurality of source/drain regions SD may be connected to an upper conductive line (not shown) through the plurality of source/drain contact patterns CA. Each of the plurality of source/drain contact patterns CA may include a metal film, a metal nitride film, or an alloy film. Each of the metal film, the metal nitride film, and the alloy film may include at least one metal selected from Ti, Ta, W, Ru, Al, Nb, Mo, Hf, Ni, Co, Pt, Cu, Yb, Tb, Dy, Er, and Pd. For example, each of the plurality of source/drain contact patterns CA may include tungsten (W), ruthenium (Ru), aluminium (Al), molybdenum (Mo), cobalt (Co), or copper (Cu).

A metal silicide film 152 may be between the source/drain region SD and the source/drain contact pattern CA. The source/drain contact pattern CA may have a bottom surface in contact with the metal silicide film 152. In some example embodiments, the metal silicide film 152 may include Ti, W, Ru, Nb, Mo, Hf, Ni, Co, Pt, Yb, Tb, Dy, Er, or Pd. For example, the metal silicide film 152 may include titanium silicide.

A constituent material of the unified conductive pattern 140S may be the same as a constituent material of the source/drain contact pattern CA. Thus, a constituent material exposed at an uppermost surface of the unified conductive pattern 140S may be the same as a constituent material exposed at an uppermost surface of the source/drain contact pattern CA. Each of the plurality of source/drain contact patterns CA may have an uppermost surface at the first vertical level LV1. The uppermost surface of each of the plurality of source/drain contact patterns CA may extend parallel to the main surface 110M of the substrate 110 at the first vertical level LV1.

A top surface of each of the insulating spacer 120 and the inter-gate dielectric film 128 may be covered by an insulating guide film 160. The insulating guide film 160 may include a portion covering an uppermost surface of the insulating spacer 120 and a portion covering an uppermost surface of the inter-gate dielectric film 128. The insulating guide film 160 may not cover a top surface of each of the unified conductive pattern 140S and the source/drain contact pattern CA. In some example embodiments, the insulating guide film 160 may include an aluminium oxide film or a silicon oxide film, without being limited thereto.

The insulating guide film 160 may be covered by an etch stop film 172. The etch stop film 172 may conformally cover a surface of the insulating guide film 160 and the top surface of the source/drain contact pattern CA. The etch stop film 172 may be covered by an interlayer insulating film 174. In some example embodiments, the etch stop film 172 may include silicon carbide (SiC), silicon nitride (SiN), nitrogen-doped silicon carbide (SiC:N), silicon oxycarbide (SiOC), aluminium nitride (AlN), aluminium oxynitride (AlON), aluminium oxide (AlO), aluminium oxycarbide (AlOC), or a combination thereof, without being limited thereto. The interlayer insulating film 174 may include an oxide film, a nitride film, an ultralow-k (ULK) film having an ultralow dielectric constant K of about 2.2 to about 2.4, or a combination thereof. For example, the interlayer insulating film 174 may include a tetraethylorthosilicate (TEOS) film, a high-density plasma (HDP) film, a boro-phospho-silicate glass (BPSG) film, a flowable chemical vapor deposition (FCVD) oxide film, a silicon oxynitride (SiON) film, a silicon nitride (SiN) film, a silicon oxycarbide (SiOC) film, a SiCOH film, or a combination thereof, without being limited thereto.

As shown in FIGS. 3A and 3C, a gate contact pattern CB may be on the gate line GL. The gate contact pattern CB may pass through the interlayer insulating film 174 and the etch stop film 172 in a vertical direction (Z direction) and have a bottom surface in contact with the unified conductive pattern 140S of the gate line GL. A lower portion of the gate contact pattern CB adjacent to the gate line GL may include a portion self-aligned by the insulating guide film 160 and the etch stop film 172.

As shown in FIGS. 3A and 3B, a via contact pattern CAV may be on the source/drain contact pattern CA. The via contact pattern CAV may pass through the interlayer insulating film 174 and the etch stop film 172 in the vertical direction (Z direction) and have a bottom surface in contact with the source/drain contact pattern CA. A lower portion of the via contact pattern CAV adjacent to the source/drain contact pattern CA may include a portion self-aligned by the insulating guide film 160 and the etch stop film 172.

In some example embodiments, each of the gate contact pattern CB and the via contact pattern CAV may include a metal film, a metal nitride film, or an alloy film. Each of the metal film, the metal nitride film, and the alloy film may include at least one metal selected from Ti, Ta, W, Ru, Al, Nb, Mo, Hf, Ni, Co, Pt, Cu, Yb, Tb, Dy, Er, and Pd. For example, each of the gate contact pattern CB and the via contact pattern CAV may include W, Ru, Al, Mo, Co, or Cu.

As shown in FIG. 3C, in the first direction (X direction), a width GW1 of the unified conductive pattern 140S may be greater than a width of the multilayered conductive film structure 140 and less than a width of the gate contact pattern CB. However, the inventive concepts are not limited to that shown in FIG. 3C, and a width of each of the unified conductive pattern 140S, the multilayered conductive film structure 140, and the gate contact pattern CB may be variously selected.

Referring to FIG. 2, in the logic cell LC, a ground line VSS may be connected to the fin-type active region FA in the first device region RX1 through some of the plurality of source/drain contact patterns CA, and a power line VDD may be connected to the fin-type active region FA in the second device region RX2 through some others of the plurality of source/drain contact patterns CA. The ground line VSS and the power line VDD may include wirings formed at a higher level than respective top surfaces of the plurality of gate contact patterns CB. The ground line VSS and the power line VDD each may include a conductive barrier film and a wiring conductive layer. The conductive barrier film may include Ti, Ta, TiN, TaN, or a combination thereof. The wiring conductive film may include Co, Cu, W, an alloy thereof, or a combination thereof.

In the IC device 100 shown in FIGS. 3A to 3C, the gate line GL may include the multilayered conductive film structure 140 and the unified conductive pattern 140S. The multilayered conductive film structure 140 may include a plurality of conductive patterns including at least two kinds of different materials (e.g., at least a first conductive pattern including a first material and a second conductive pattern including a second material different from the first material). The unified conductive pattern 140S may be in contact with a top surface of each of the plurality of conductive patterns in the multilayered conductive film structure 140 and form an uppermost surface of the gate line GL. The unified conductive pattern 140S may include the same material as a constituent material of the source/drain contact pattern CA. In addition, the IC device 100 may include the insulating guide film 160, which is selectively formed only on an insulating film, from among a conductive film and the insulating film. That is, the IC device 100 may include the insulating guide film 160 configured to selectively cover only an uppermost surface of each of the insulating spacers 120 and the inter-gate dielectric film 128, both of which include insulating materials. The gate line GL, the source/drain contact pattern CA, the insulating spacers 120, and the inter-gate dielectric film 128 may have the uppermost surfaces extending in a lateral direction parallel to a main surface 110M of the substrate 110 at the first vertical level LV1. The insulating guide film 160 may contribute toward obtaining a sufficient insulation distance between adjacent conductive regions. For example, sufficient insulation distances may be obtained by the insulating guide film 160 between the gate line GL and the source/drain contact pattern CA that are adjacent to each other, between the gate line GL and the via contact pattern CAV that are adjacent to each other, and the gate contact pattern CB and the via contact pattern CAV that are adjacent to each other. Accordingly, the IC device 100 may have a structure capable of preventing or mitigating problems (e.g., undesired short circuits), which may occur between adjacent conductive regions.

Furthermore, the gate contact pattern CB and the via contact pattern CAV may be self-aligned by the insulating guide film 160 and accurately contacted at desired positions. Therefore, electrical connection between the gate line GL and the gate contact pattern CB and electrical connection between the source/drain contact pattern CA the via contact pattern CAV may be facilitated, and contact resistances therebetween may be reduced.

Figure 4:
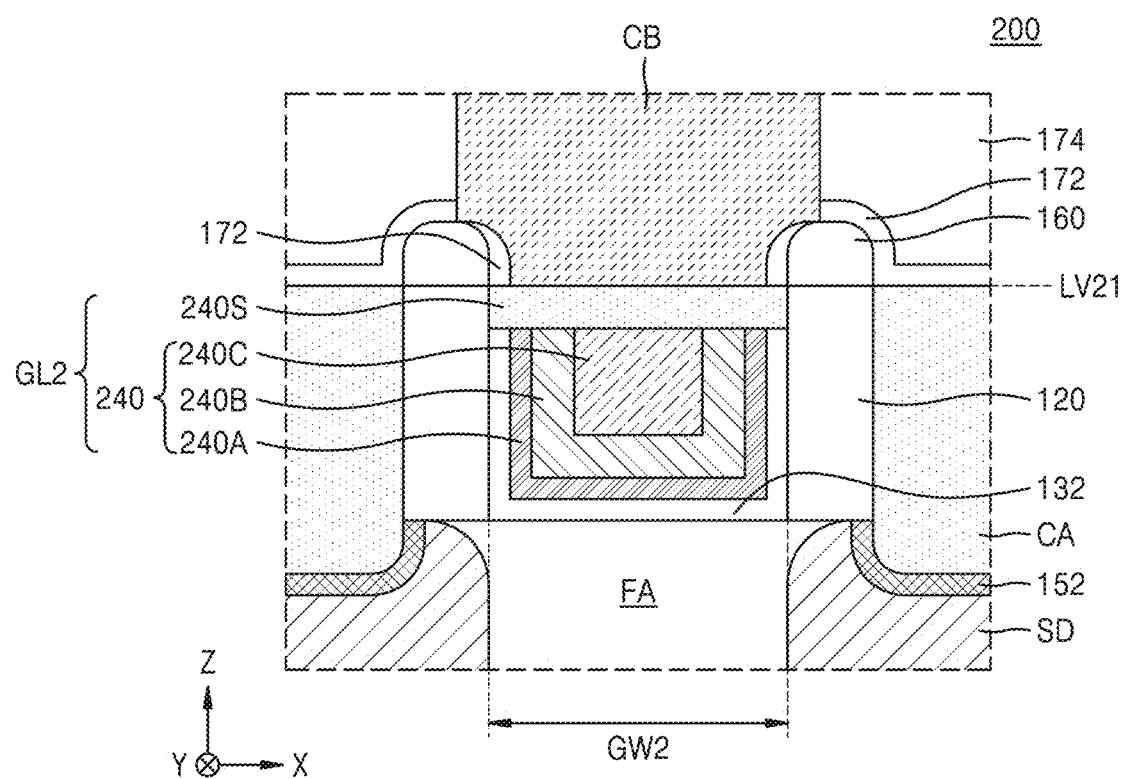
FIG. 4 is a cross-sectional view of an IC device according to some example embodiments.

FIG. 4 is a cross-sectional view of an IC device 200 according to some example embodiments. FIG. 4 is an enlarged view of a configuration of a region corresponding to region "EX1" of FIG. 3A.

Referring to FIG. 4, the IC device 200 may include at least one logic cell LC included in the cell block 12 shown in FIG. 1. The IC device 200 may have substantially the same configuration as the IC device 100 described with reference to FIGS. 1 and 3A to 3C. However, the IC device 200 may include the gate line GL2 instead of the gate line GL.

The gate line GL2 may have substantially the same configuration as the gate line GL, which has been described with reference to FIGS. 3A and 3C. However, a width of the gate line GL2 may be greater than a width of the gate line GL of the IC device 100 in a first direction (X direction). The gate line GL2 may include a multilayered conductive film structure 240 and a unified conductive pattern 240S. The multilayered conductive film structure 240 has a top surface formed by a plurality of conductive patterns including at least three kinds of different materials (e.g., at least a first conductive pattern including a first material and a second conductive pattern including a second material, and a third conductive pattern including a third material, the first, second, third material being different materials from each other). The unified conductive pattern 240S covers the top surface of the multilayered conductive film structure 240. The multilayered conductive film structure 240 may include a first metal-containing film (e.g., the first conductive pattern) 240A, a second metal-containing film (e.g., the second conductive pattern) 240B, and a third metal-containing film (e.g., the third conductive pattern) 240C that are sequentially stacked on the fin-type active region FA and include different materials, respectively. An uppermost surface of each of the first metal-containing film 240A, the second metal-containing film 240B, and the third metal-containing film 240C may be in contact with a bottom surface of the unified conductive pattern 240S. In some example embodiments, the first metal-containing film 240A in the multilayered conductive film structure 240 may be in contact with the gate insulating film 132.

In the first direction (X direction), a width GW2 of the unified conductive pattern 240S may be greater than a width of the multilayered conductive film structure 240 and less than a width of the gate contact pattern CB. However, the inventive concepts are not limited to the example shown in FIG. 4. In the IC device 200, a width of each of the unified conductive pattern 240S, the multilayered conductive film structure 240, and the gate contact pattern CB may be variously selected.

In the gate line GL2, constituent materials of the first metal-containing film 240A, the second metal-containing film 240B, and the unified conductive pattern 240S may be respectively the same as those of the first metal-containing film 140A, the second metal-containing film 140B, and the unified conductive pattern 140S, which have been described with reference to FIGS. 3A and 3C. The third metal-containing film 240C may include a tungsten film or an aluminium film, without being limited thereto. The width GW2 of the unified conductive pattern 240S in the gate line GL2 may be greater than the width GW1 of the unified conductive pattern 140S in the gate line GL shown in FIG. 3C.

An uppermost surface of the unified conductive pattern 240S may correspond to an uppermost surface of the gate line GL2. The uppermost surface of the gate line GL2, an uppermost surface of the insulating spacer 120, and an uppermost surface of a source/drain contact pattern CA may extend parallel to a main surface (refer to 110M in FIG. 3A) of the substrate 110 at the first vertical level LV21 on the substrate 110.

Figure 5A:
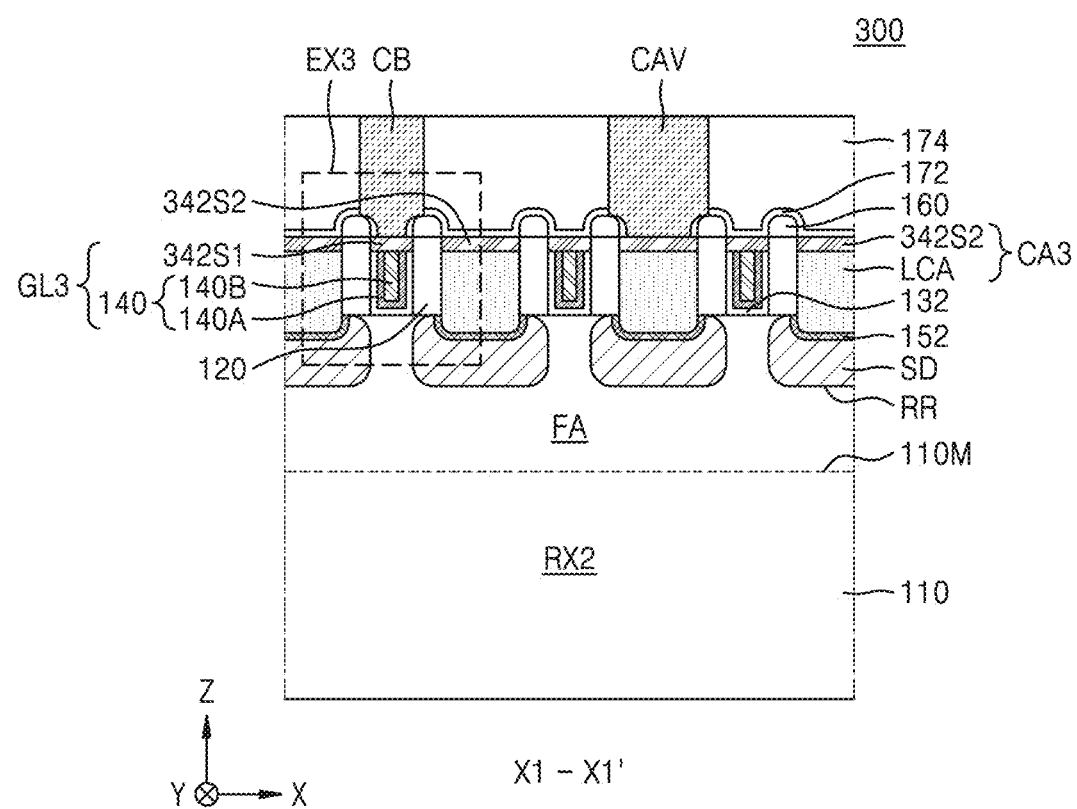
FIGS. 5A and 5B are cross-sectional views of an IC device according to some example embodiments.
Figure 5B:
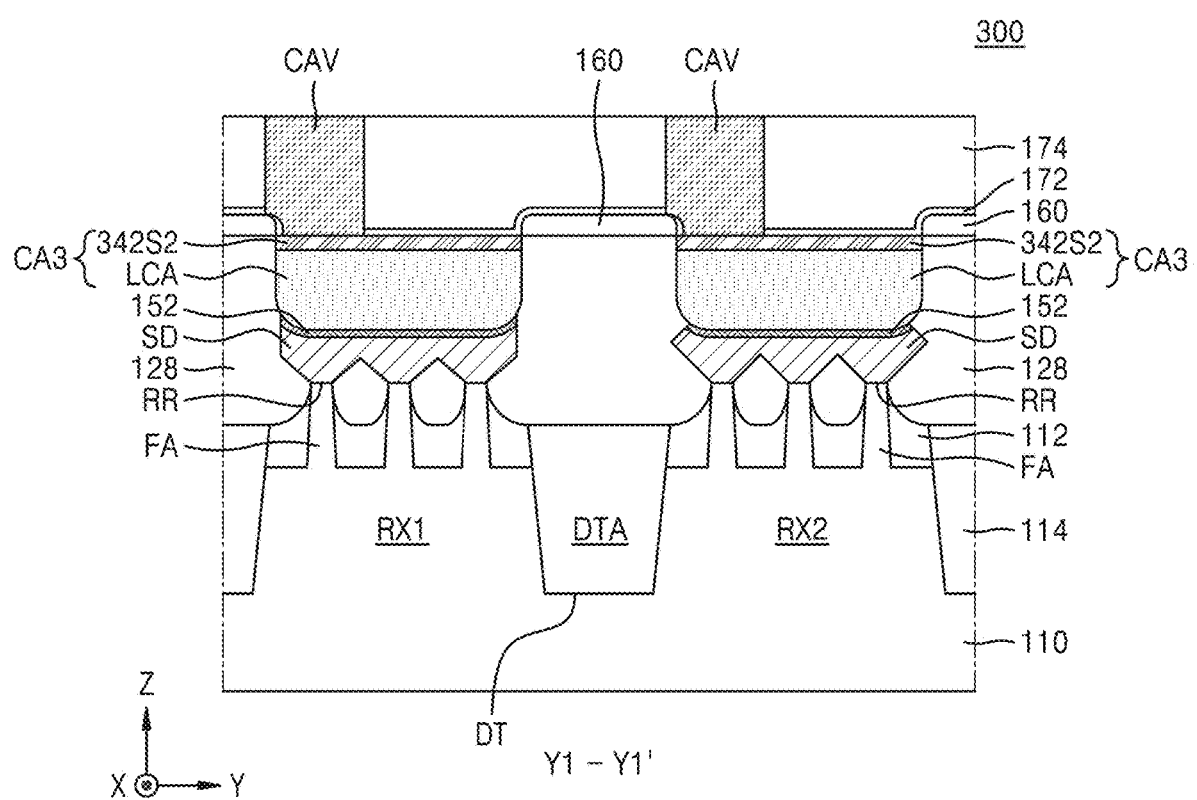
Figure 5C:
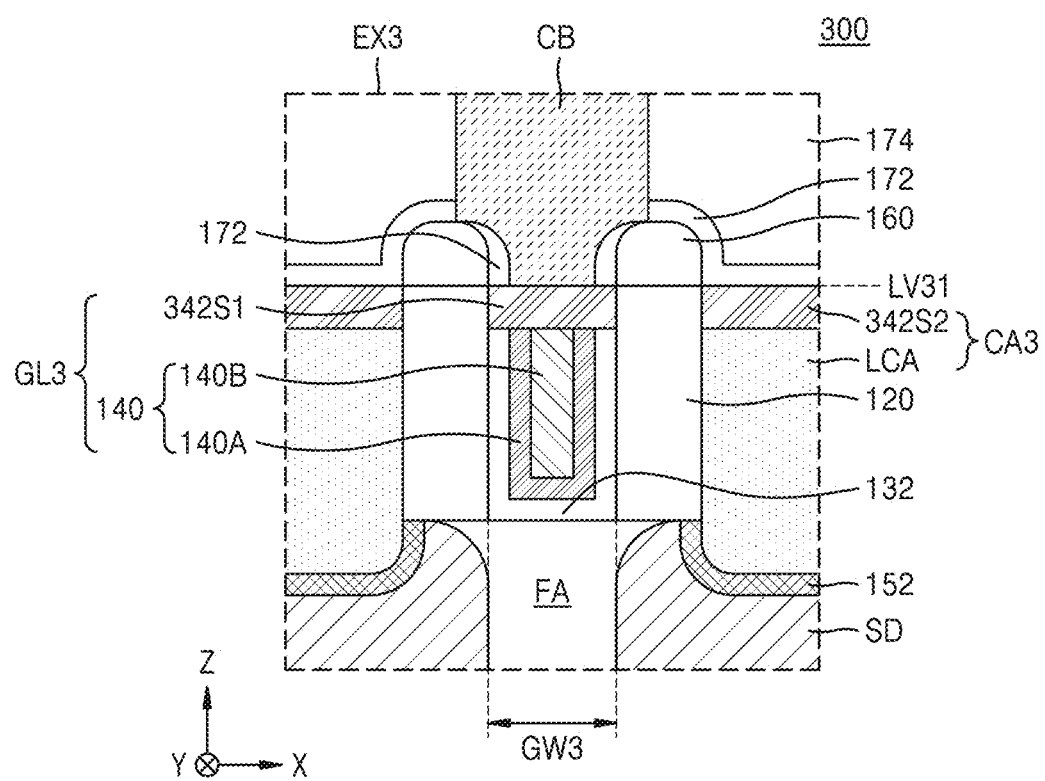
FIG. 5C is an enlarged cross-sectional view of region "EX3" of FIG. 5A.

FIGS. 5A to 5C are cross-sectional views of an IC device 300, according to some example embodiments. FIG. 5A is a cross-sectional view of some components of a portion corresponding to the cross-section taken along line X1-X1' of FIG. 2, and FIG. 5B is a cross-sectional view of some components of a portion corresponding to the cross-section taken along line Y1-Y1' of FIG. 2. FIG. 5C is an enlarged cross-sectional view of region "EX3" of FIG. 5A.

Referring to FIGS. 5A to 5C, the IC device 300 may include at least one logic cell LC included in the cell block 12 shown in FIG. 1. The IC device 300 may have substantially the same configuration as the IC device 100, which has been described with reference to FIGS. 1 and 3A to 3C. However, the IC device 300 may include the gate line GL3 instead of the gate line GL and include a source/drain contact pattern CA3 instead of the source/drain contact pattern CA.

In the IC device 300, the gate line GL3 may have substantially the same configuration as the gate line GL, which has been described above with reference to FIGS. 3A and 3C. However, the gate line GL3 may include a multilayered conductive film structure 140 including a first metal-containing film 140A and a second metal-containing film 140B and a unified conductive pattern 342S1 covering a top surface of the multilayered conductive film structure 140. An uppermost surface of the unified conductive pattern 342S1 in the gate line GL3 may extend parallel to a main surface 110M of the substrate 110 at a first vertical level LV31 on a substrate 110.

In the IC device 300, the source/drain contact pattern CA3 may include a lower source/drain contact unit LCA and an upper source/drain contact unit 342S2 that are sequentially stacked on the metal silicide film 152. The lower source/drain contact unit LCA may have a bottom surface in contact with the metal silicide film 152 and an uppermost surface, which extends in a direction parallel to a main surface 110M of the substrate 110 at a vertical level that is closer to the substrate 110 than the first vertical level LV31. The upper source/drain contact unit 342S2 may have a bottom surface in contact with the uppermost surface of the lower source/drain contact unit LCA and an uppermost surface that extends in the lateral direction parallel to a main surface 110M of the substrate 110 at the first vertical level LV31.

In the IC device 300, the unified conductive pattern 342S1 of the gate line GL3 may include the same material as the upper source/drain contact unit 342S2 of the source/drain contact pattern CA3. For example, the unified conductive pattern 342S1 and the upper source/drain contact unit 342S2 may include a metal film including the same metal selected from Ti, Ta, W, Ru, Al, Nb, Mo, Hf, Ni, Co, Pt, Cu, Yb, Tb, Dy, Er, and Pd.

In some example embodiments, the lower source/drain contact unit LCA and the upper source/drain contact unit 342S2, which are in the source/drain contact pattern CA3, may include different materials. For example, the lower source/drain contact unit LCA and the upper source/drain contact unit 342S2 may include different metals, each of which is selected from Ti, Ta, W, Ru, Al, Nb, Mo, Hf, Ni, Co, Pt, Cu, Yb, Tb, Dy, Er, and Pd.

In other example embodiments, the lower source/drain contact unit LCA and the upper source/drain contact unit 342S2, which are in the source/drain contact pattern CA3, may include the same material. For example, the lower source/drain contact unit LCA and the upper source/drain contact unit 342S2 may include the same metal selected from Ti, Ta, W, Ru, Al, Nb, Mo, Hf, Ni, Co, Pt, Cu, Yb, Tb, Dy, Er, and Pd.

As shown in FIG. 5C, in a first direction (X direction), a width GW3 of the unified conductive pattern 342S1 may be greater than a width of the multilayered conductive film structure 140 and less than a width of the gate contact pattern CB. However, the inventive concepts are not limited to the example shown in FIG. 5C, and a width of each of the unified conductive pattern 342S1, the multilayered conductive film structure 140, and the gate contact pattern CB may be variously selected.

Figure 6:
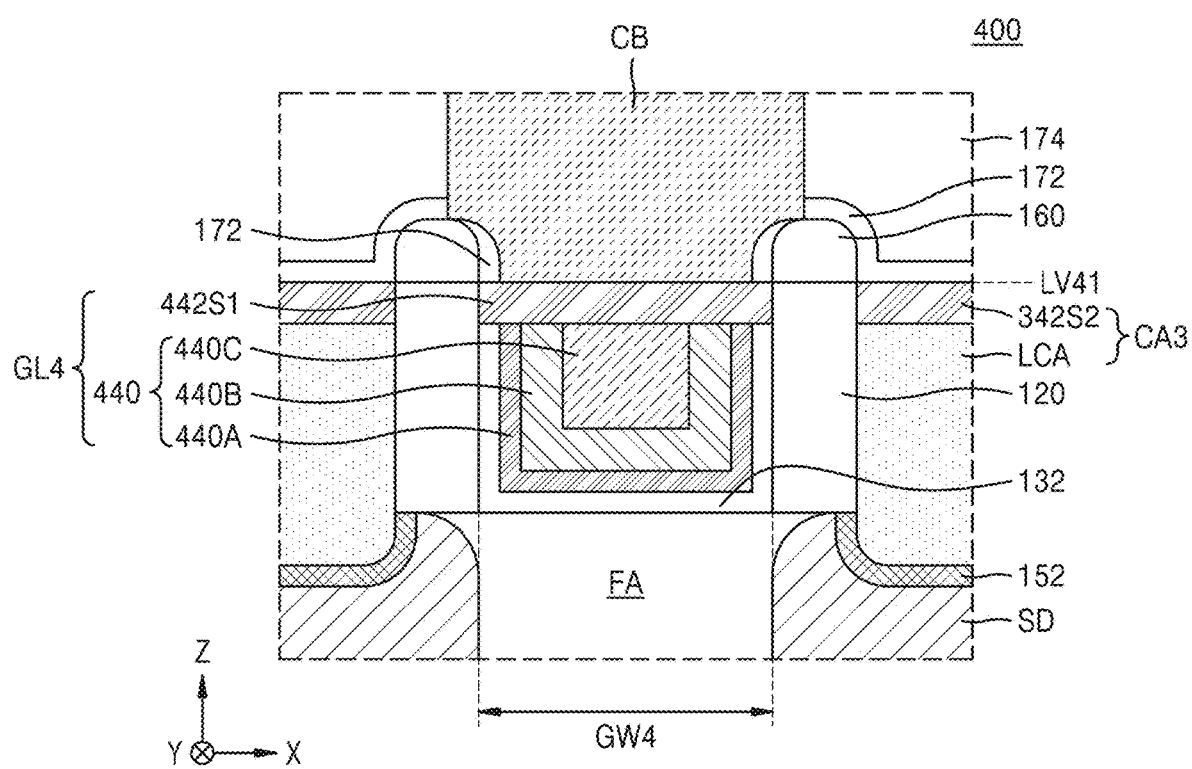
FIG. 6 is a cross-sectional view of an IC device according to some example embodiments.

FIG. 6 is a cross-sectional view of an IC device 400, according to some example embodiments. FIG. 6 is an enlarged view of components in a region corresponding to region "EX3" of FIG. 5A.

Referring to FIG. 6, the IC device 400 may include at least one logic cell LC included in the cell block 12 shown in FIG. 1. The IC device 400 may have substantially the same configuration as the IC device 300 described with reference to FIGS. 5A to 5C. However, the IC device 400 may include a gate line GL4 instead of the gate line GL3.

The gate line GL4 may have substantially the same configuration as the gate line GL3 described with reference to FIGS. 5A and 5C. However, a width of the gate line GL4 may be greater than a width of the gate line GL3 of the IC device 300 in a first direction (X direction). The gate line GL4 may include a multilayered conductive film structure 440 and a unified conductive pattern 442S1. The multilayered conductive film structure 440 has a top surface formed by a plurality of conductive patterns including at least three kinds of different materials (e.g., at least a first conductive pattern including a first material and a second conductive pattern including a second material, and a third conductive pattern including a third material, the first, second, third material being different materials from each other). The unified conductive pattern 442S1 covers a top surface of the multilayered conductive film structure 440. The multilayered conductive film structure 440 may include a first metal-containing film (e.g., the first conductive film) 440A, a second metal-containing film (e.g., the second conductive film) 440B, and a third metal-containing film (e.g., the third conductive film) 440C that are sequentially stacked on the fin-type active region FA and include different materials, respectively. An uppermost surface of each of the first metal-containing film 440A, the second metal-containing film 440B, and the third metal-containing film 440C may be in contact with a bottom surface of the unified conductive pattern 442S1. In some example embodiments, the first metal-containing film 440A in the multilayered conductive film structure 440 may be in contact with a gate insulating film 132.

In the first direction (X direction), a width GW4 of the unified conductive pattern 442S1 may be greater than a width of the multilayered conductive film structure 440 and less than a width of a gate contact pattern CB. However, the inventive concepts are not limited to the example shown in FIG. 6. In the IC device 400, a width of each of the unified conductive pattern 442S1, the multilayered conductive film structure 440, and the gate contact pattern CB may be variously selected.

In the gate line GL4, constituent materials of the first metal-containing film 440A and the second metal-containing film 440B may be the same as those of the first metal-containing film 140A and the second metal-containing film 140B, respectively, that are described with reference to FIGS. 3A and 3C. A constituent material of the unified conductive pattern 442S1 may be the same as a constituent material of the unified conductive pattern 342S1, which is described with reference to FIGS. 5A and 5C. The third metal-containing film 440C may include a tungsten (W) film or an aluminium (Al) film, without being limited thereto. The width GW4 of the unified conductive pattern 442S1 in the gate line GL4 may be greater than the width GW3 of the unified conductive pattern 342S1 in the gate line GL3 shown in FIG. 5C.

An uppermost surface of the unified conductive pattern 442S1 may correspond to an uppermost surface of the gate line GL4. The uppermost surface of the gate line GL4, an uppermost surface of the insulating spacer 120, and an uppermost surface of a source/drain contact pattern CA3 may extend parallel to a main surface (refer to 110M in FIG. 5A) of the substrate 110 at the first vertical level LV41 on the substrate 110.

In the IC device 400, the source/drain contact pattern CA3 may include a lower source/drain contact unit LCA and an upper source/drain contact unit 342S2 that are sequentially stacked on the metal silicide film 152. Detailed descriptions of the lower source/drain contact unit LCA and the upper source/drain contact unit 342S2 may be the same as those described with reference to FIGS. 5A to 5C.

In the IC devices 200, 300, and 400 shown in FIGS. 4 to 6, the gate lines GL2, GL3, and GL4 may include the multilayered conductive film structure and the unified conductive patterns 240S, 342S1, and 442S1. The multilayered conductive film structure may include a least one or more of a plurality of conductive patterns including different material(s) from the other(s) of the plurality of conductive patterns. The unified conductive patterns 240S, 342S1, and 442S1 may be in contact with a top surface of the multilayered conductive film structure and form uppermost surfaces of the gate lines GL2, GL3, and GL4. The unified conductive patterns 240S, 342S1, and 442S1 may include the same material as a constituent material of the source/drain contact patterns CA and CA3 (e.g., the uppermost surfaces of the source/drain contact patterns CA and CA3). In addition, each of the IC devices 200, 300, and 400 may include an insulating guide film 160, which is selectively formed only on an insulating film, from among a conductive film and the insulating film. Therefore, each of the IC devices 200, 300, and 400 may produce the same effects as those of the IC device 100, which have been described with reference to FIGS. 3A to 3C.

Figure 7:
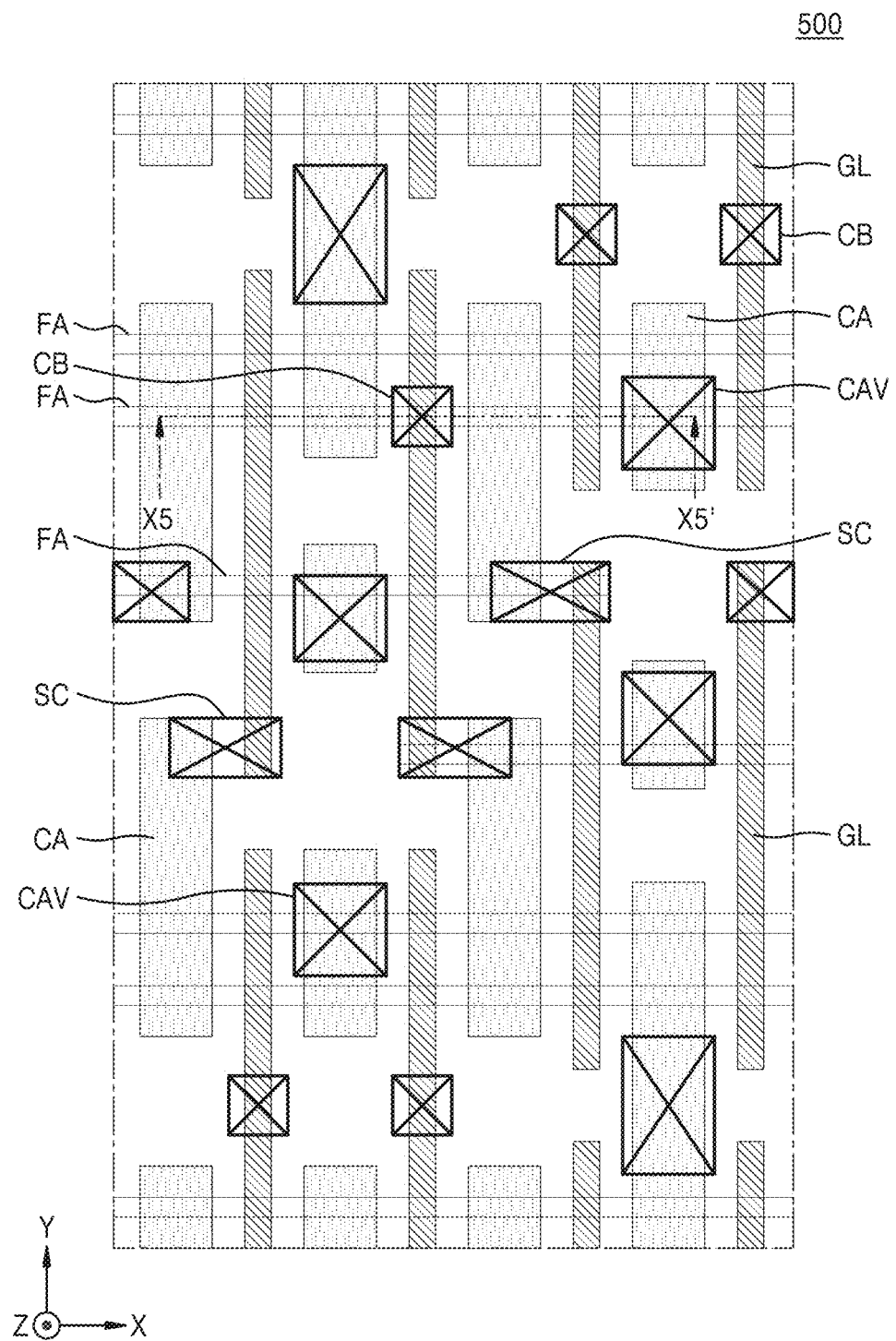
FIG. 7 is a plan layout diagram of an IC device according to some example embodiments.
Figure 8:
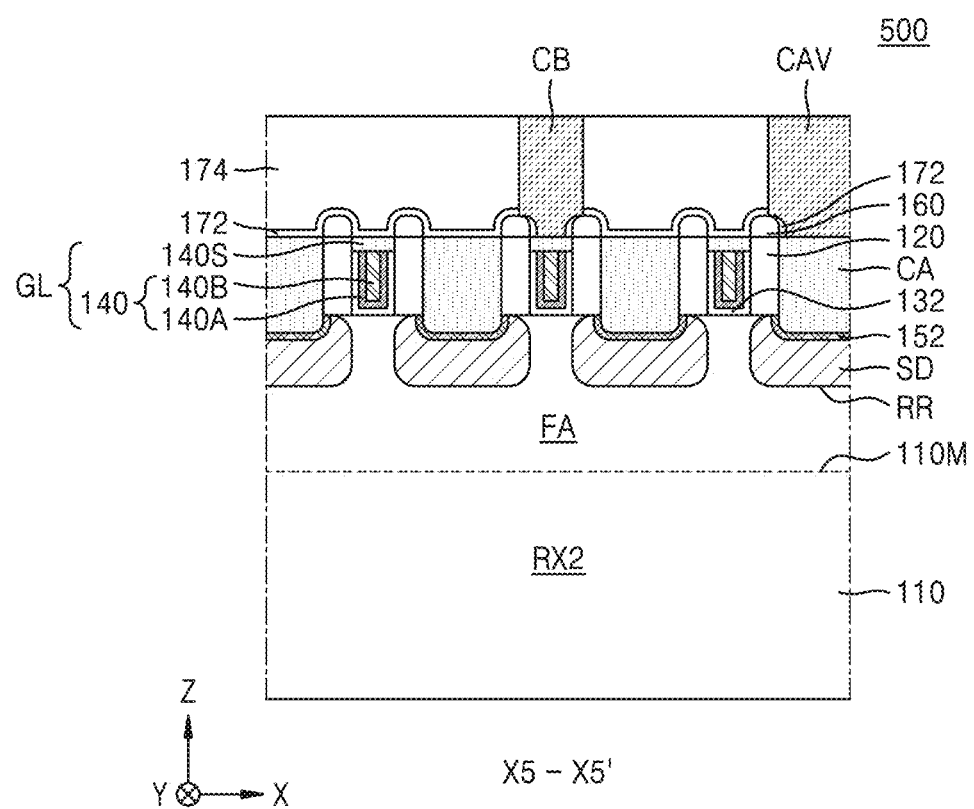
FIG. 8 is a cross-sectional view taken along line X5-X5' of FIG. 7.

FIG. 7 is a plan layout diagram of an IC device 500 according to some example embodiments. FIG. 8 is a cross-sectional view taken along line X5-X5' of FIG. 7. In FIGS. 7 and 8, the same reference numerals are used to denote the same elements as in FIGS. 1 and 3A to 3C, and repeated descriptions thereof are omitted. The IC device 500 shown in FIGS. 7 and 8 may include a static random access memory (SRAM) array including a plurality of SRAM cells arranged in a matrix form on a substrate 110.

Referring to FIGS. 7 and 8, the IC device 500 may include a plurality of fin-type active regions FA and a plurality of gate lines GL. The plurality of fin-type active regions FA may extend parallel to each other in a first direction (X direction). The plurality of gate lines GL may extend parallel to each other in a second direction (Y direction) on the plurality of fin-type active regions FA. A transistor may be formed at each of intersections between the plurality of fin-type active regions FA and the plurality of gate lines GL. Each of the plurality of SRAM cells included in the IC device 500 may include a plurality of pull-up transistors, a plurality of pull-down transistors, and a plurality of pass transistors. The plurality of pull-up transistors may include PMOS transistors, and the plurality of pull-down transistors and the plurality of pass transistors may include NMOS transistors. The IC device 500 may include a plurality of shared contacts SC, each of which has a common connection to the gate line GL and the source/drain region SD.

As shown in FIG. 8, in the IC device 500, each of a plurality of source/drain regions SD may be covered by a metal silicide film 152, and a source/drain contact pattern CA may be formed on the metal silicide film 152. The source/drain contact pattern CA may be apart from the gate line GL in the first direction (X direction) with the gate insulating film 132 and the insulating spacer 120 therebetween.

A top surface of the insulating spacer 120 may be covered by an insulating guide film 160. The insulating guide film 160 may be covered by an etch stop film 172. The etch stop film 172 may be covered by an interlayer insulating film 174. A gate contact pattern CB may be on the gate line GL and pass through the interlayer insulating film 174 and the etch stop film 172 in a vertical direction (Z direction). A lower portion of the gate contact pattern CB adjacent to the gate line GL may include a portion self-aligned by the insulating guide film 160 and the etch stop film 172.

A via contact pattern CAV may be on the source/drain contact pattern CA and pass through the interlayer insulating film 174 and the etch stop film 172 in the vertical direction (Z direction). A lower portion of the via contact pattern CAV adjacent to the source/drain contact pattern CA may include a portion self-aligned by the insulating guide film 160 and the etch stop film 172.

In other example embodiments, the IC device 500 may include the gate line GL2 shown in FIG. 4, the gate line GL3 shown in FIGS. 5A and 5C, or the gate line GL4 shown in FIG. 6 instead of the gate line GL. In still other example embodiments, the IC device 500 may include the source/drain contact pattern CA3 shown in FIGS. 5A to 5C instead of the source/drain contact pattern CA.

In the IC device 500 shown in FIGS. 7 and 8, the gate line GL may include a multilayered conductive film structure 140 and a unified conductive pattern 140S. The multilayered conductive film structure 140 includes a plurality of conductive patterns including at least two kinds of different materials (e.g., at least a first conductive pattern including a first material and a second conductive pattern including a second material different from the first material). The unified conductive pattern 140S may be in contact with a top surface of the multilayered conductive film structure 140 and form an uppermost surface of the gate line GL. The unified conductive pattern 140S may include the same material as a constituent material of the source/drain contact pattern CA (e.g., an uppermost surface of the source/drain contact pattern CA). In addition, the IC device 500 may include an insulating guide film 160, which is selectively formed only on an insulating film, from among a conductive film and the insulating film. Therefore, the IC device 500 may produce the same effects as those of the IC device 100, which have been described with reference to FIGS. 3A to 3C.

Figure 9:
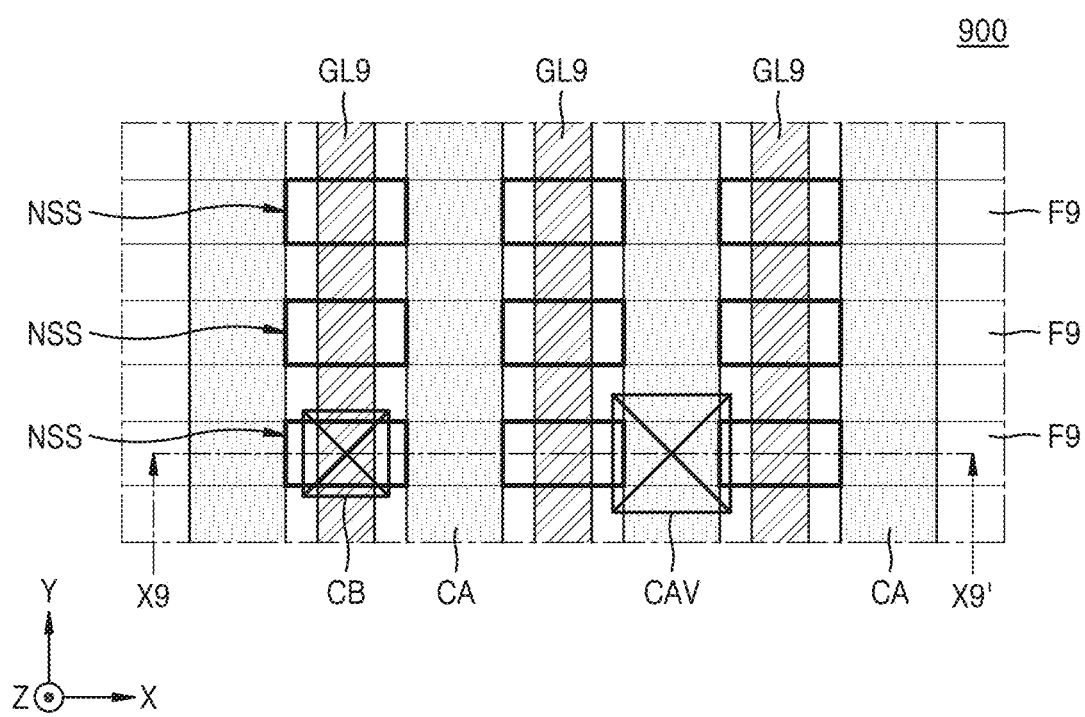
FIG. 9 is a plan layout diagram of some components of an IC device, according to some example embodiments.
Figure 10:
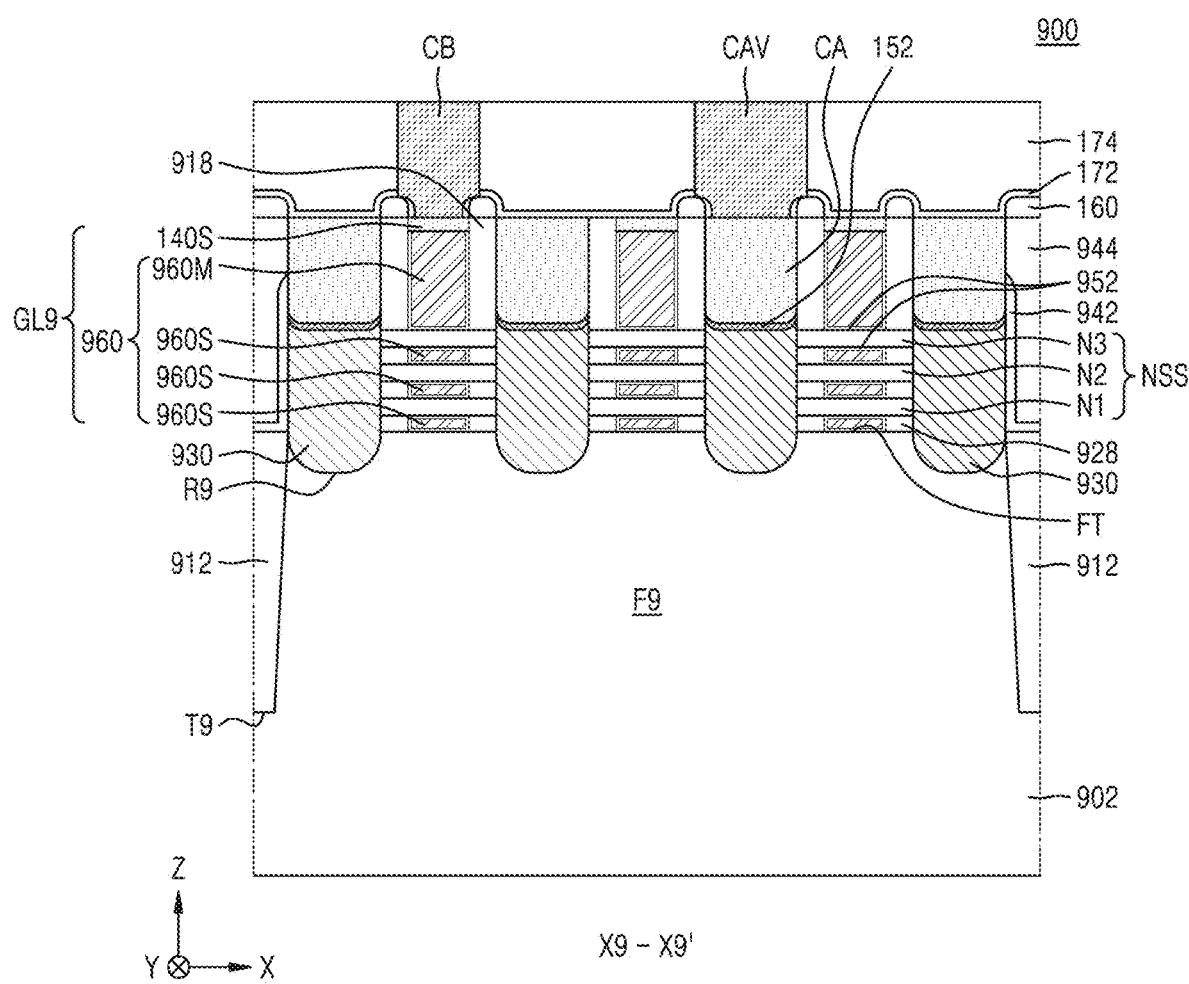
FIG. 10 is a cross-sectional view taken along line X9-X9' of FIG. 9.

FIG. 9 is a plan layout diagram of some components of an IC device 900 according to some example embodiments. FIG. 10 is a cross-sectional view taken along line X9-X9' of FIG. 9. In FIGS. 9 and 10, the same reference numerals are used to denote the same elements as in FIGS. 1 and 3A to 3C, and repeated descriptions thereof are omitted.

Referring to FIGS. 9 and 10, the IC device 900 may include a plurality of fin-type active regions F9 and a plurality of nanosheet stacks NSS. The plurality of fin-type active regions F9 may protrude from a substrate 902 and elongate in a first direction (X direction). The plurality of nanosheet stacks NSS may face top surfaces FT of the plurality of fin-type active regions F9 at positions apart from the plurality of fin-type active regions F9) upward in a vertical direction (Z direction). As used herein, the term "nanosheet" refers to a conductive structure having a cross-section substantially perpendicular to a direction in which current flows. The nanosheet may be interpreted as including a nanowire.

Trenches T9 may be formed in the substrate 902 to define the plurality of fin-type active regions F9, and filled with a device isolation film 912. The substrate 902, the plurality of fin-type active regions F9, and the device isolation film 912 may have substantially the same configurations as those of the substrate 110, the fin-type active region FA, and the device isolation film 112, which are described with reference to FIGS. 3A to 3C.

A plurality of gate lines GL9 may extend in a second direction (Y direction) on the plurality of fin-type active regions F9. The plurality of nanosheet stacks NSS may be on the top surfaces FT of the plurality of fin-type active regions F9, respectively, at intersections between the plurality of fin-type active regions F9 and the plurality of gate lines GL9 and face the top surfaces FT of the fin-type active regions F9 at positions apart from the fin-type active regions F9. A plurality of nanosheet transistors may be formed at intersections between the plurality of fin-type active regions F9 and the plurality of gate lines GL9 on the substrate 902, respectively.

Each of the plurality of nanosheet stacks NSS may include a plurality of nanosheets (e.g., N1, N2, and N3), which overlap each other in the vertical direction (Z direction) on the top surface FT of the fin-type active region F9. The plurality of nanosheets (e.g., N1, N2, and N3) may include a first nanosheet N1, a second nanosheet N2, and a third nanosheet N3 that are at different distances from the top surface FT of the fin-type active region F9 in the vertical direction, respectively.

Although FIG. 9 illustrates a case in which the nanosheet stack NSS has a substantially rectangular planar shape, the inventive concepts are not limited thereto. The nanosheet stack NSS may have various planar shapes according to a planar shape of each of the fin-type active region F9 and the gate line 960. The present example embodiment pertains to a configuration in which the plurality of nanosheet stacks NS S and the plurality of gate lines GL9 are formed on one fin-type active region F9, and the plurality of nanosheet stacks NSS are arranged in a line in the first direction (X direction) on one fin-type active region F9. However, according to some example embodiments of the inventive concepts, the number of nanosheet stacks NSS on one fin-type active region F9 is not specifically limited. For example, one nanosheet stack NSS may be formed on one fin-type active region F9. The present example embodiment pertains to a case in which each of the plurality of nanosheet stacks NSS includes three nanosheets, but the inventive concepts are not limited thereto. For example, the nanosheet stack NSS may include at least two nanosheets, and the number of nanosheets in the nanosheet stack NSS is not specifically limited.

Each of the first to third nanosheets N1, N2, and N3 may have a channel region. In some example embodiments, each of the first to third nanosheets N1, N2, and N3 may include a Si layer, a SiGe layer, or a combination thereof.

A plurality of recess regions R9 may be formed in upper portions of the fin-type active regions F9, and the plurality of source/drain regions 930 may be in the plurality of recess regions R9. The plurality of source/drain regions 930 may include an epitaxially grown semiconductor layer. A detailed configuration of the plurality of source/drain regions 930 may be substantially the same as that of the source/drain region SD described with reference to FIGS. 3A to 3C.

The gate line GL9 may cover the nanosheet stack NSS and surround each of the first to third nanosheets N1, N2, and N3 on the fin-type active region F9. Each of the plurality of nanosheets N1, N2, and N3 may have a gate-all-around (GAA) structure surrounded by the gate line GL9.

A gate insulating film 952 may be between the nanosheet stack NSS and the gate line GL9. The gate insulating film 952 may have substantially the same configuration as the gate insulating film 132 described with reference to FIGS. 3A to 3C.

The gate line GL9 may include a multilayered conductive film structure 960 and a unified conductive pattern 140S covering a top surface of the multilayered conductive film structure 960. A bottom surface of the unified conductive pattern 140S may be in contact with the top surface of the multilayered conductive film structure 960 and a top surface of the gate insulating film 952. A width of the unified conductive pattern 140S may be greater than a width of the multilayered conductive film structure 960 in the first direction (X direction).

The multilayered conductive film structure 960 may include a main gate portion 960M and a plurality of sub-gate portions 960S. The main gate portion 960M may cover a top surface of the nanosheet stack NSS and elongate in the second direction (Y direction). The plurality of sub-gate portions 960S may be integrally connected to the main gate portion 960M and arranged one by one between the first to third nanosheets N1, N2, and N3 and between the fin-type active region F9 and the first nanosheet N1, respectively. The main gate portion 960M may have the same structure as the multilayered conductive film structure 140 described with reference to FIGS. 3A and 3B or the multilayered conductive film structure 240 described with reference to FIG. 4. The sub-gate portion 960S may include the same material as at least a portion of the main gate portion 960M.

Both sidewalls of each of the plurality of gate lines GL9 may be covered by outer insulating spacers 918. The plurality of outer insulating spacers 918 may cover both sidewalls of each of the main gate portion 960M and the unified conductive pattern 140S on the plurality of nanosheet stacks NSS. The plurality of source/drain regions 930 may be covered by an insulating liner 942. Each of the outer insulating spacers 918 and the insulating liner 942 may include SiN, SiCN, SiBN, SiON, SiOCN, SiBCN, SiOC, SiO$_2$, or a combination thereof. The insulating liner 942 may be omitted.

A plurality of inner insulating spacers 928 may be between the first to third nanosheets N1, N2, and N3 and between the fin-type active region F9 and the first nanosheet Ni. Both sidewalls of each of the plurality of sub-gate portions 960S may be covered by the inner insulating spacers 928 with the gate insulating film 952 therebetween. The plurality of inner insulating spacers 928 may be between the plurality of sub-gate portions 960S and the source/drain region 930. In some example embodiments, the outer insulating spacers 918 and the inner insulating spacers 928 may include the same insulating material. In other example embodiments, the outer insulating spacers 918 may include a different material from the inner insulating spacers 928. The inner insulating spacer 928 may include SiN, SiCN, SiBN, SiON, SiOCN, SiBCN, SiOC, SiO$_2$, or a combination thereof. The inner insulating spacers 928 may further include air gaps.

The insulating liner 942 may be covered by an inter-gate dielectric film 944. The inter-gate dielectric film 944 may include a silicon oxide film. A plurality of source/drain contact patterns CA may be on the source/drain region 930 and pass through the inter-gate dielectric film 944 and the insulating liner 942 in a vertical direction. A metal silicide film 152 may be formed on a top surface of each of the plurality of source/drain regions 930. Each of the plurality of source/drain contact patterns CA may be connected to the source/drain region 930 through the metal silicide film 152.

An uppermost surface of the unified conductive pattern 140S of the gate line GL9, an uppermost surface of the outer insulating spacer 918, and an uppermost surface of the source/drain contact pattern CA may each extend parallel to a main surface 110M of the substrate 902 at the same vertical level on the substrate 902.

A top surface of each of the outer insulating spacer 918 and the inter-gate dielectric film 944 may be covered by an insulating guide film 160. The insulating guide film 160 may be covered by an etch stop film 172. The etch stop film 172 may be covered by an interlayer insulating film 174. A gate contact pattern CB may be on the gate line GL9 and pass through the interlayer insulating film 174 and the etch stop film 172 in a vertical direction (Z direction). A lower portion of the gate contact pattern CB adjacent to the gate line GL may include a portion self-aligned by the insulating guide film 160 and the etch stop film 172.

A via contact pattern CAV may be on the source/drain contact pattern CA and pass through the interlayer insulating film 174 and the etch stop film 172 in the vertical direction (Z direction). A lower portion of the via contact pattern CAV adjacent to the source/drain contact pattern CA may include a portion self-aligned by the insulating guide film 160 and the etch stop film 172.

In other example embodiments, the IC device 900 may include the source/drain contact pattern CA3 including the lower source/drain contact unit LCA and the upper source/drain contact unit 342S2, which is shown in FIG. 5C, instead of the source/drain contact pattern CA. In this case, the unified conductive pattern 140S in the gate line GL9 may include the same material as the upper source/drain contact unit 342S2 in the source/drain contact pattern CA3.

In the IC device 900 shown in FIGS. 9 and 10, the gate line GL9 may include a multilayered conductive film structure 960 and a unified conductive pattern 140S. The multilayered conductive film structure 960 may include a plurality of conductive patterns including at least two kinds of different materials (e.g., at least a first conductive pattern including a first material and a second conductive pattern including a second material different from the first material). The unified conductive pattern 140S may be in contact with the top surface of the multilayered conductive film structure 960 and form an uppermost surface of the gate line GL9. The unified conductive pattern 140S may include the same material as a constituent material of the source/drain contact pattern CA (e.g., the uppermost surface of the source/drain contact pattern CA). In addition, the IC device 900 may include the insulating guide film 160, which is selectively formed only on an insulating film, from among a conductive film and the insulating film. Therefore, the IC device 900 may produce the same effects as those of the IC device 100, which have been described with reference to FIGS. 3A to 3C.

Hereinafter, methods of manufacturing IC devices, according to some example embodiments, will be described with reference to specific examples.

FIGS. 11A to 25B are cross-sectional views of a process sequence of a method of manufacturing an IC device, according to some example embodiments. FIGS. 11A, 12A, 13 to 19, 20A, 21 to 23, 24A, and 25A are cross-sectional views of a portion corresponding to the cross-section taken along line X1-X1' of FIG. 2, according to the process sequence. FIGS. 11B, 12B, 20B, 24B, and 25B are cross-sectional views of a portion corresponding to the cross-section taken along line Y1-Y1' of FIG. 2, according to the process sequence. An example method of manufacturing the IC device 100 shown in FIGS. 2 and 3A to 3C will be described with reference to FIGS. 11A to 25B.

Figure 11A:
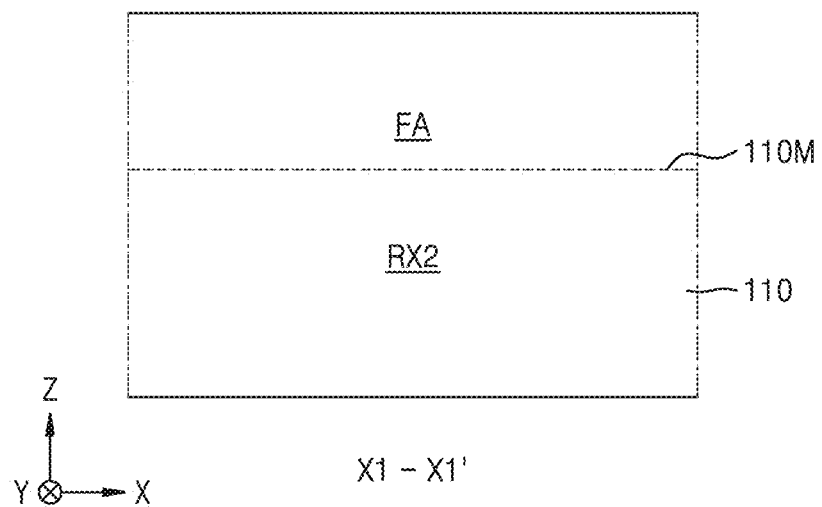
Figure 11B:
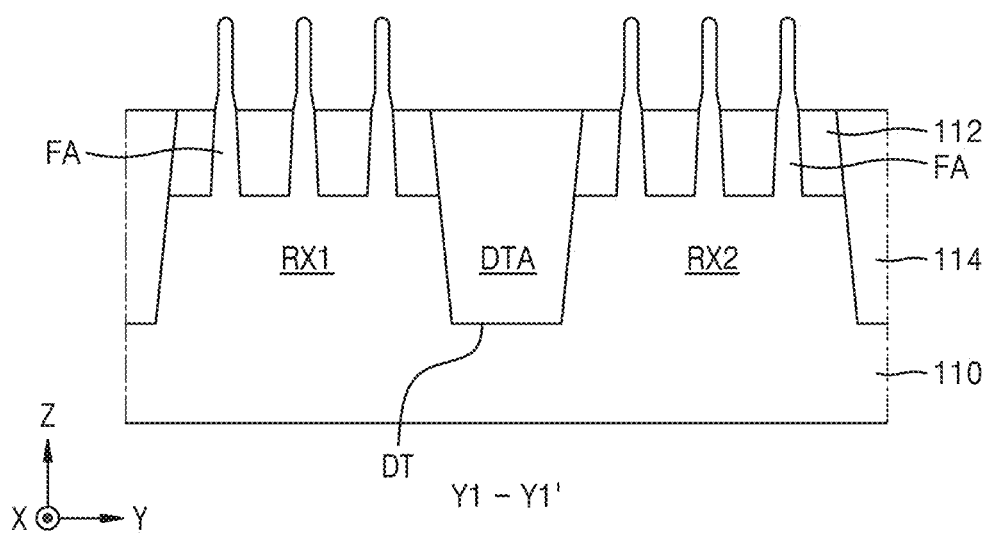

Referring to FIGS. 11A and 11B, in a first device region RX1 and a second device region RX2, a partial region of a substrate 110 may be etched to form a plurality of fin-type active regions FA, which protrude upward from a main surface 110M of the substrate 110 in a vertical direction (Z direction) and extend parallel to each other in a first direction (X direction). A device isolation film 112 may be formed to cover both lower sidewalls of each of the plurality of fin-type active regions FA. In an inter-device isolation region DTA, a portion of the device isolation film 112 and a portion of the substrate 110 may be etched to form a deep trench DT defining the first device region RX1 and the second device region RX2, and the deep trench DT may be filled with an inter-device isolation insulating film 114. In the first device region RX1 and the second device region RX2, the plurality of fin-type active regions FA may protrude over a top surface of the device isolation film 112.

Figure 12A:
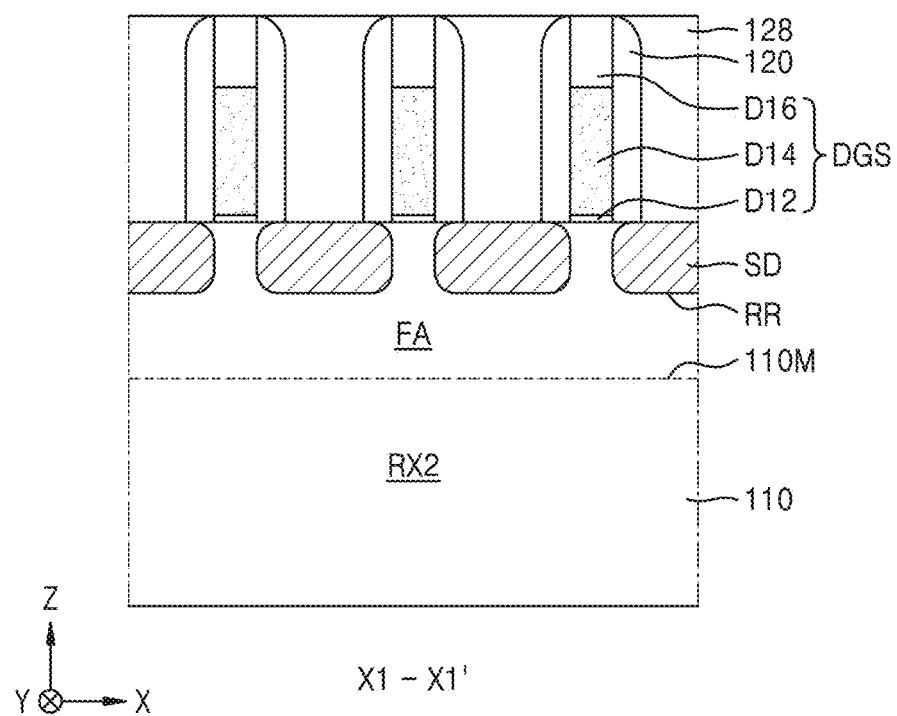
Figure 12B:
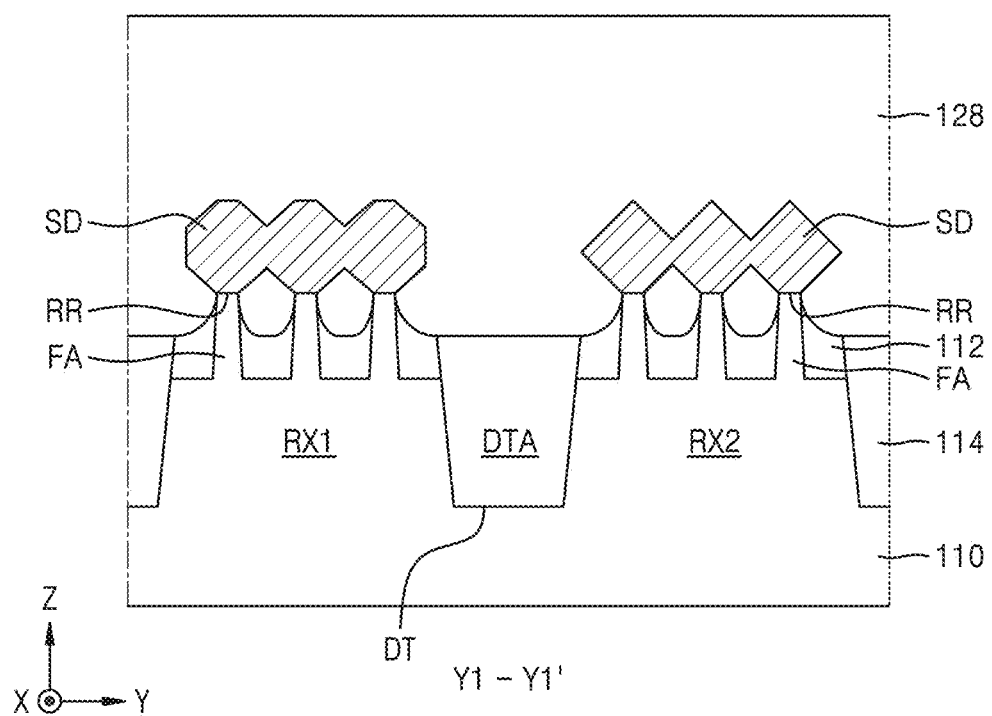

Referring to FIGS. 12A and 12B, a plurality of dummy gate structures DGS may be formed on the device isolation film 112 and inter-device isolation insulating film 114. The plurality of dummy gate structures DGS may intersect with the plurality of fin-type active regions FA and elongate in a second direction (Y direction). Each of the plurality of dummy gate structures DGS may include a dummy gate insulating film D12, a dummy gate line D14, and a dummy insulating capping layer D16 that are sequentially stacked on the plurality of fin-type active regions FA. The dummy gate insulating film D12 may include silicon oxide. The dummy gate line D14 may include polysilicon. The dummy insulating capping layer D16 may include silicon nitride.

Insulating spacers 120 may be formed on both sidewalls of the dummy gate structure DGS, and portions of each of the plurality of fin-type active regions FA exposed on both sides of the dummy gate structure DGS may be etched to form a recess region RR in a top surface of each of the plurality of fin-type active regions FA. Thereafter, a plurality of source/drain regions SD may be formed to fill the plurality of recess regions RR.

An inter-gate dielectric film 128 may be formed to cover the device isolation film 112, the inter-device isolation insulating film 114, the plurality of source/drain regions SD, and the plurality of source/drain regions SD between the plurality of dummy gate structures DGS. In some example embodiments, before the inter-gate dielectric film 128 is formed, a process of forming an insulating liner (not shown) to cover the plurality of source/drain regions SD may be further performed. The insulating liner may include SiN, SiCN, SiBN, SiON, SiOCN, SiBCN, SiOC, $SiO_2$, or a combination thereof.

Figure 13:
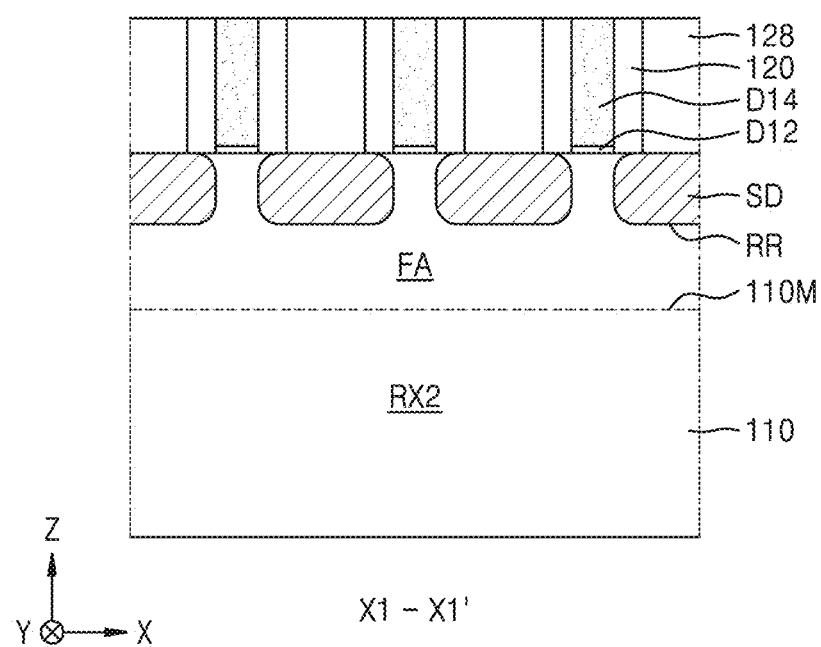

Referring to FIG. 13, in the resultant structure of FIGS. 12A and 12B, the dummy insulating capping layer D16 and insulating films adjacent thereto may be removed using a chemical mechanical polishing (CMP) process to expose the dummy gate line D14. In this case, heights of the inter-gate dielectric film 128 and the plurality of insulating spacers 120 may be reduced.

Figure 14:
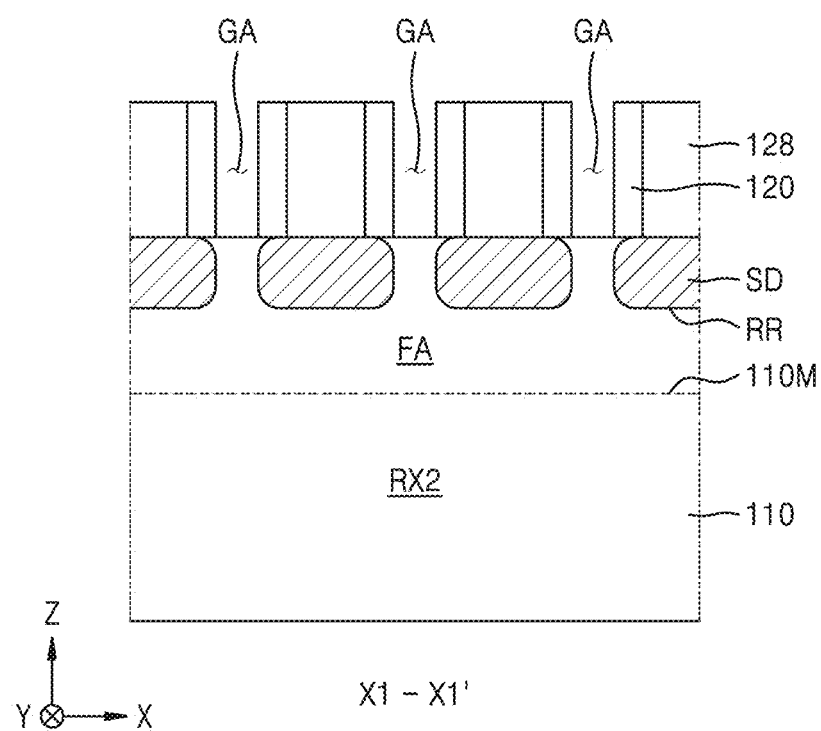

Referring to FIG. 14, a plurality of dummy gate lines D14 and a plurality of dummy gate insulating films D12 may be removed from the resultant structure of FIG. 13, and thus, a plurality of gate spaces GA may be provided. The insulating spacers 120 and the fin-type active region FA may be exposed through the plurality of gate spaces GA.

Figure 15:
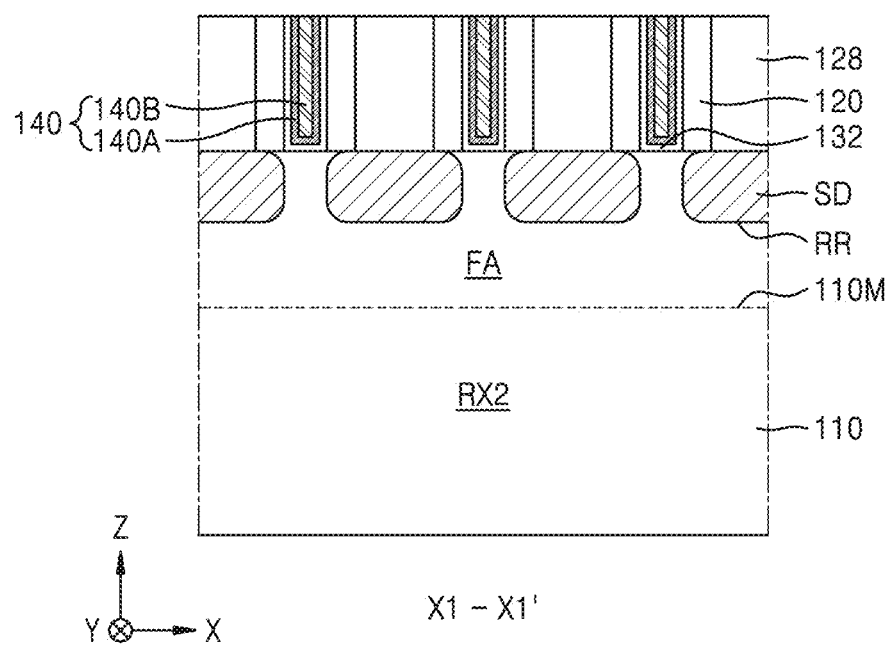

Referring to FIG. 15, in the resultant structure of FIG. 14, a gate insulating film 132 may be formed inside the plurality of gate spaces GA, and a multilayered conductive film structure 140 may be formed on the gate insulating film 132 to fill the plurality of gate spaces GA. The multilayered conductive film structure 140 may include a first metal-containing film 140A and a second metal-containing film 140B that are sequentially stacked on the gate insulating film 132.

Thereafter, the resultant structure including the gate insulating film 132 and the multilayered conductive film structure 140 may be planarized to expose top surfaces of the insulating spacers 120 and a top surface of the inter-gate dielectric film 128.

Figure 16:
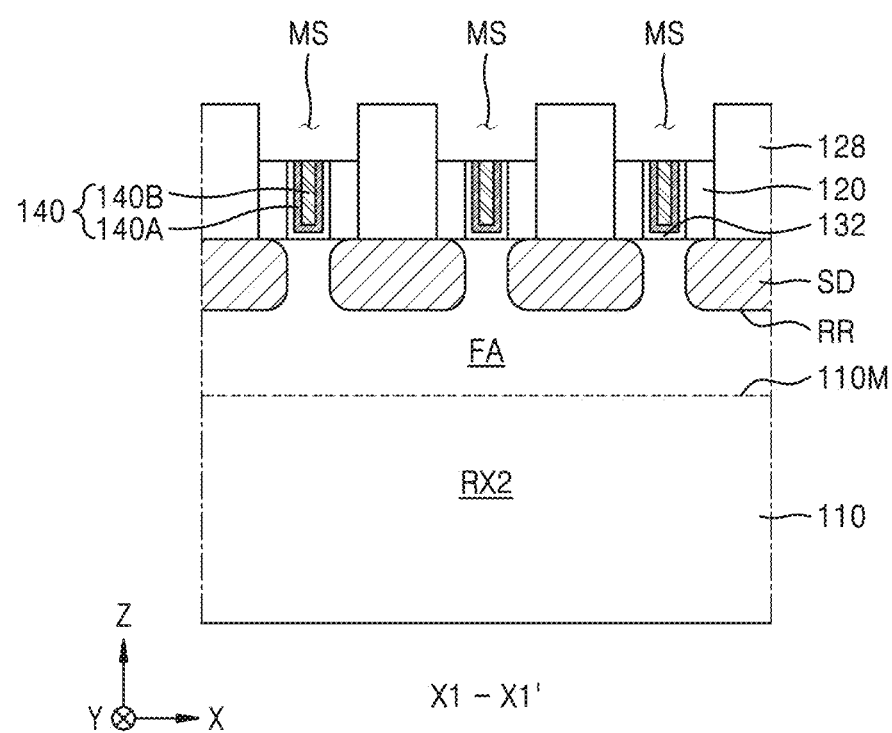

Referring to FIG. 16, in the resultant structure of FIG. 15, each of the gate insulating film 132, the multilayered conductive film structure 140, and the insulating spacers 120 may be selectively etched by a partial thickness, thereby forming a plurality of mask spaces MS, which are defined by sidewalls of the inter-gate dielectric film 128.

Figure 17:
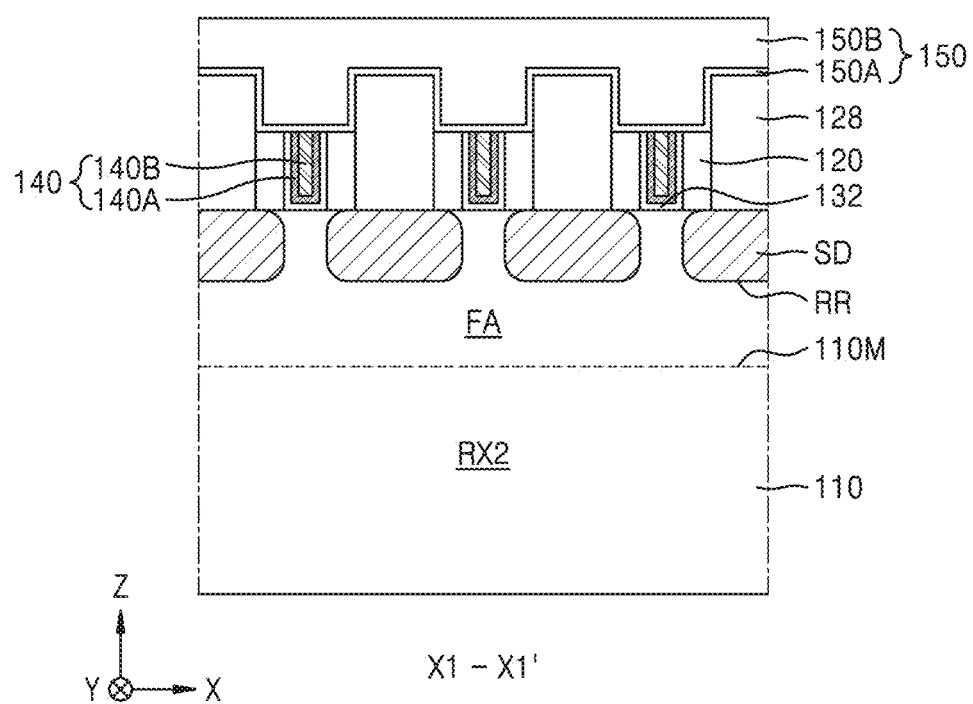

Referring to FIG. 17, in the resultant structure of FIG. 16, a hard mask layer 150 may be formed to fill the plurality of mask spaces MS and cover the top surface of the inter-gate dielectric film 128. The hard mask layer 150 may include a first hard mask layer 150A and a second hard mask layer 150B. The first hard mask layer 150A may conformally cover the resultant structure of FIG. 16. The second hard mask layer 150B may fill the plurality of mask spaces MS on the first hard mask layer 150A.

Figure 18:
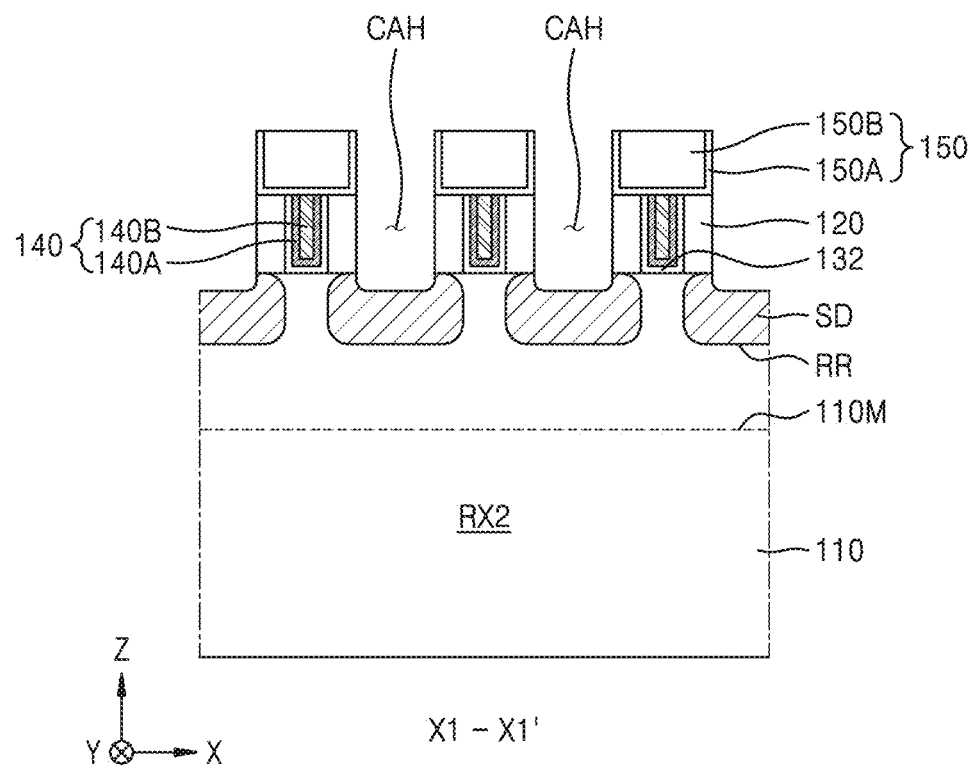

Referring to FIG. 18, the resultant structure of FIG. 17 may be planarized using a CMP process, and thus, a portion of the hard mask layer 150 may be removed until the top surface of the inter-gate dielectric film 128 is removed.

Thereafter, the inter-gate dielectric film 128 may be etched using the remaining portion of the hard mask layer 150 as an etch mask, and thus, a plurality of source/drain contact holes CAH exposing the plurality of source/drain regions SD may be formed. During an etching process for forming the plurality of source/drain contact holes CAH, a portion of a top surface of each of the plurality of source/drain regions SD may be removed.

Figure 19:
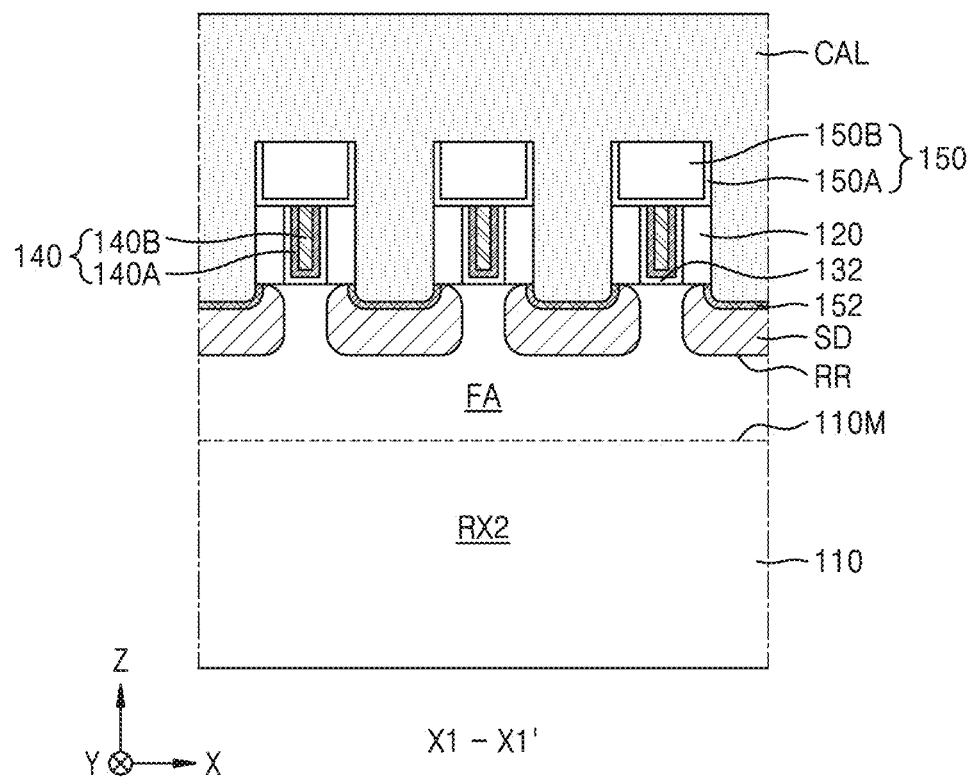

Referring to FIG. 19, in the resultant structure of FIG. 18, a metal silicide film 152 may be formed on the source/drain region SD exposed at a bottom unit of each of the plurality of source/drain contact holes CAH.

A conductive layer CAL may be formed on the metal silicide film 152 to fill the plurality of source/drain contact holes CAH and cover the hard mask layer 150.

In some example embodiments, the conductive layer CAL may include a metal film, a metal nitride film, or an alloy film, which includes at least one metal selected from Ti, Ta, W, Ru, Al, Nb, Mo, Hf, Ni, Co, Pt, Cu, Yb, Tb, Dy, Er, and Pd. For example, the conductive layer CAL may include W, Ru, Al, Mo, Co, or Cu.

Figure 20A:
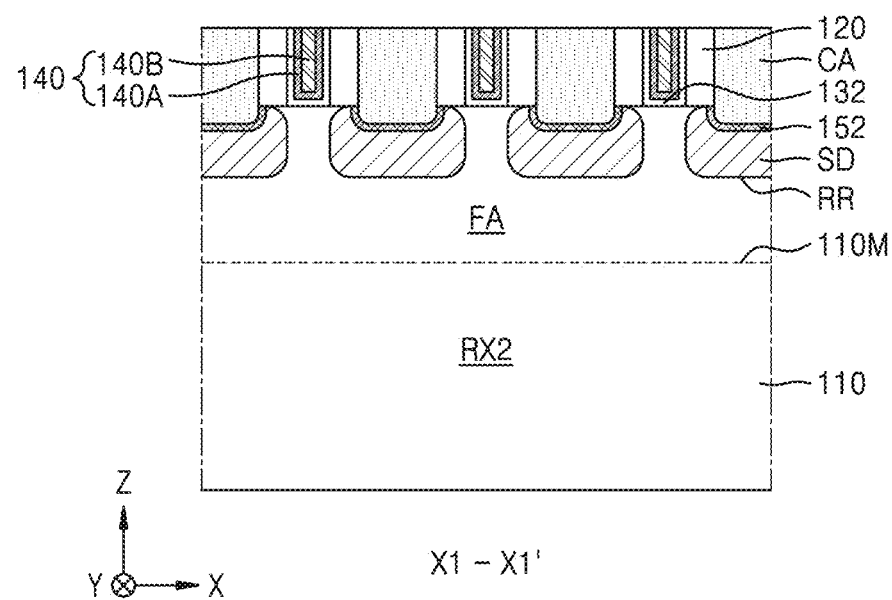
Figure 20B:
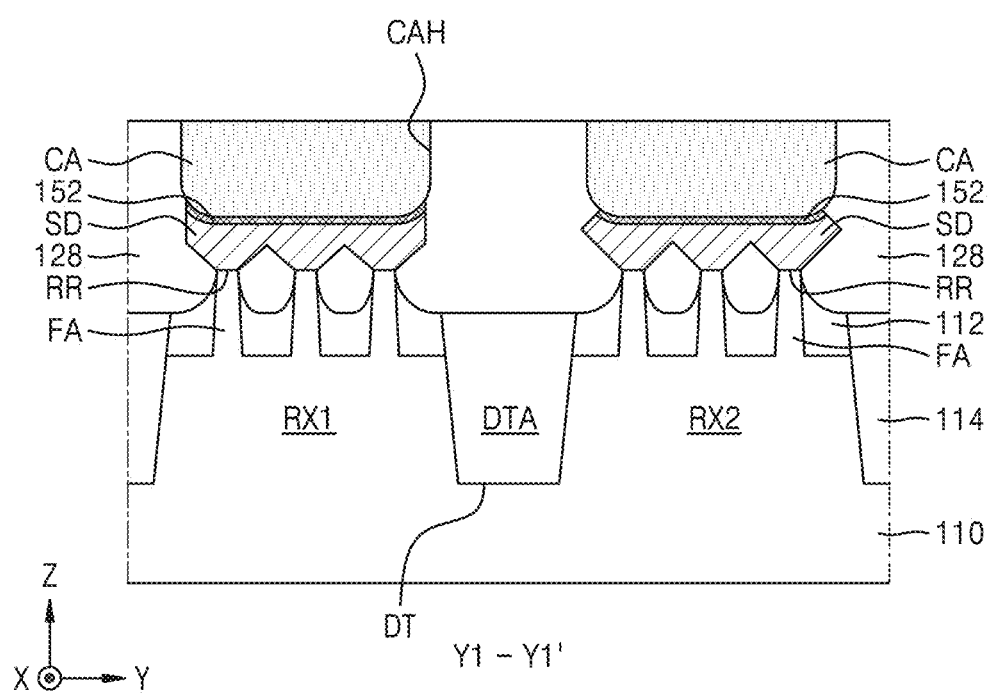

Referring to FIGS. 20A and 20B, in the resultant structure of FIG. 19, the conductive layer CAL may be planarized using a CMP process. The conductive layer CAL may be planarized using a CMP process so that the top surfaces of the insulating spacers 120 and the top surface of the inter-gate dielectric film 128 are exposed. Thus, a plurality of source/drain contact patterns CA may be formed to fill the plurality of source/drain contact holes CAH.

As shown in FIG. 20A, both sidewalls of the source/drain contact pattern CA may be covered by insulating spacers 120 in the first direction (X direction). As shown in FIG. 20B, both sidewalls of the source/drain contact pattern CA may be covered by an inter-gate dielectric film 128 in the second direction (Y direction).

Figure 21:
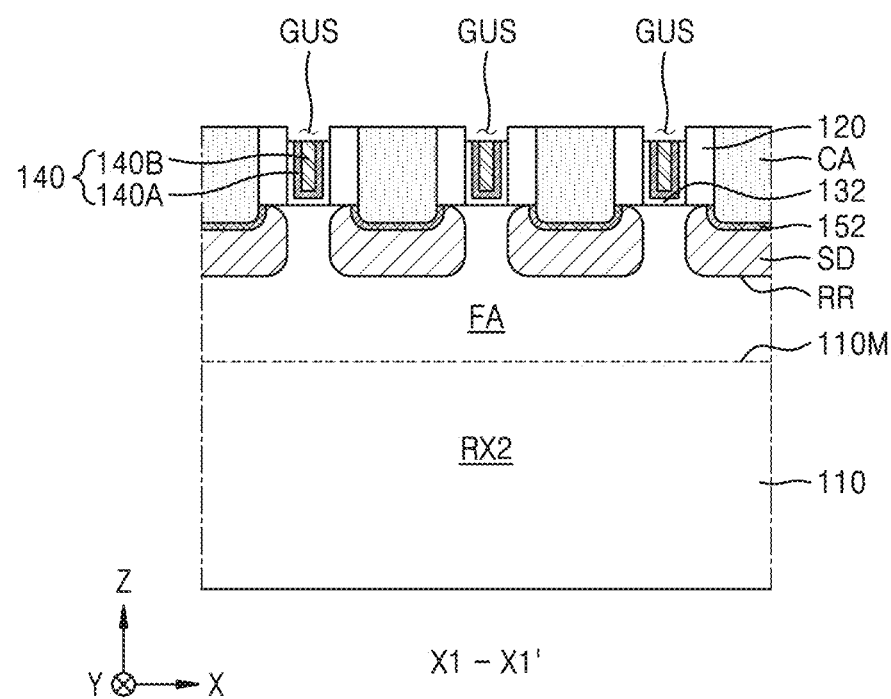

Referring to FIG. 21, the multilayered conductive film structure 140 exposed in the resultant structure of FIGS. 20A and 20B may be removed by a partial thickness from a top surface thereof. Thus, a plurality of gate upper spaces GUS, of which a width in the first direction (X direction) is defined by the insulating spacers 120 on the multilayered conductive film structure 140, may be formed.

Figure 22:
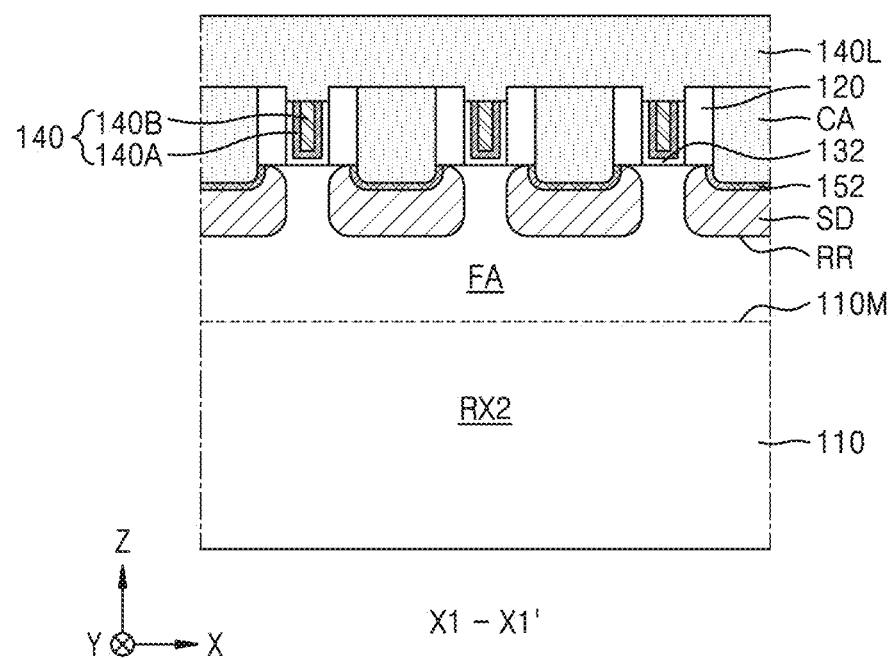

Referring to FIG. 22, a unified conductive film 140L may be formed on the resultant structure of FIG. 21 to such a sufficient thickness as to fill the plurality of gate upper spaces GUS. The unified conductive film 140L may include a metal film including one metal selected from Ti, Ta, W, Ru, Al, Nb, Mo, Hf, Ni, Co, Pt, Cu, Yb, Tb, Dy, Er, and Pd.

Figure 23:
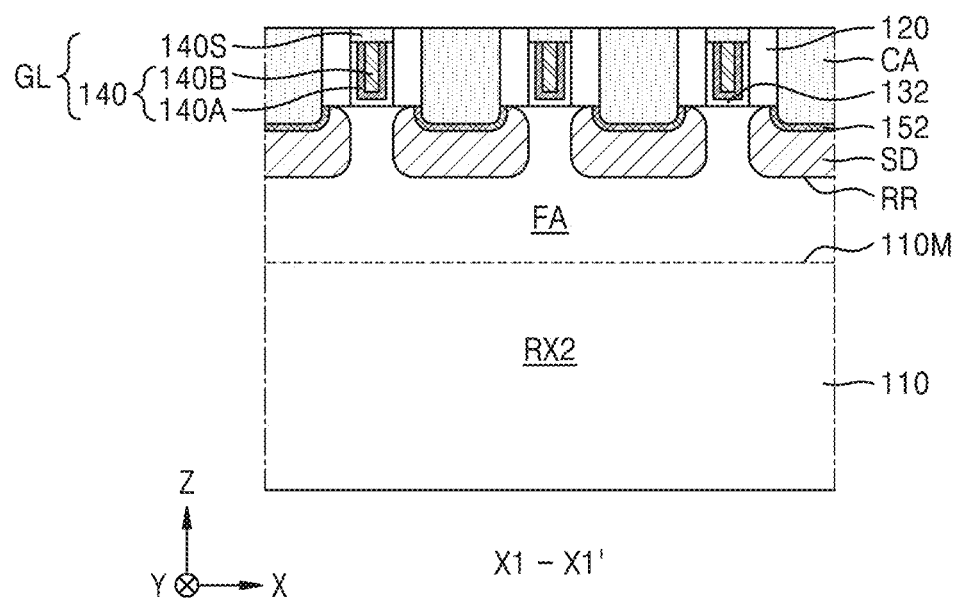

Referring to FIG. 23, the unified conductive film 140L may be planarized using a CMP process in the resultant structure of FIG. 22, and thus, the top surfaces of the insulating spacers 120 may be exposed. Thus, a plurality of unified conductive patterns 140S may be formed to cover the top surface of the multilayered conductive film structure 140 and fill the gate upper space (refer to GUS in FIG. 21). The multilayered conductive film structure 140 and the unified conductive pattern 140S may constitute a gate line GL.

Figure 24A:
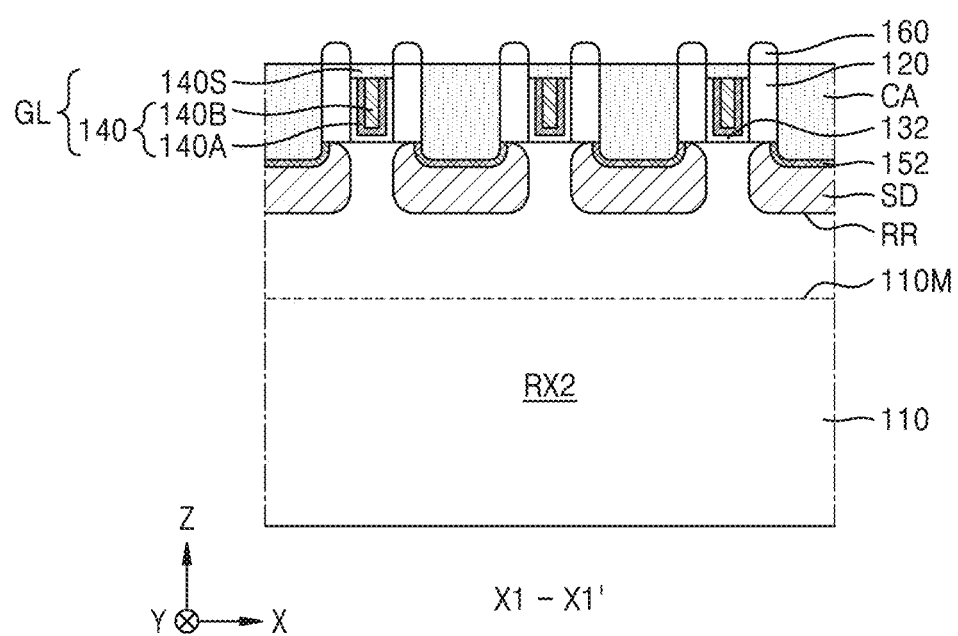
Figure 24B:
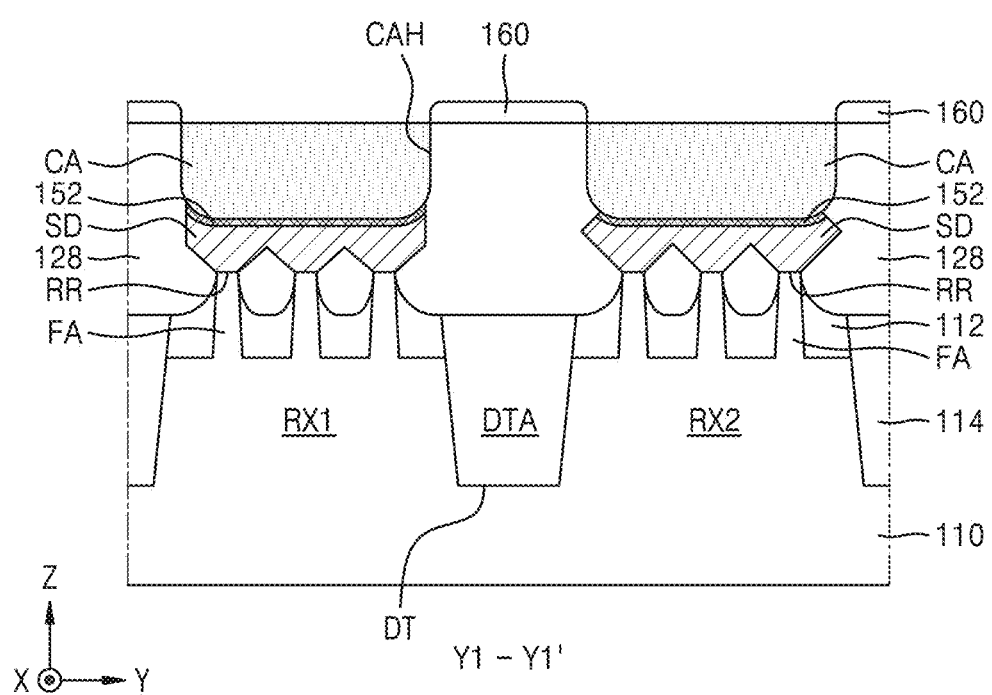

Referring to FIG. 24A and 24B, an insulating guide film 160 may be selectively formed only on insulating material regions, from among conductive material regions and the insulating material regions, which are exposed in the resultant structure on which the process described with reference to FIG. 23 is performed. Thus, the insulating guide film 160 may not be formed on a top surface of each of the plurality of unified conductive patterns 140S and a top surface of each of the plurality of source/drain contact patterns CA but may be selectively formed only on the top surface of each of the insulating spacers 120 and the top surface of the inter-gate dielectric film 128.

In some example embodiments, to form the insulating guide film 160, a deposition inhibition layer may be selectively formed on the top surface of each of the plurality of unified conductive patterns 140S and the top surface of each of the plurality of source/drain contact patterns CA that are the conductive material regions exposed in the resultant structure on which the process described with reference to FIG. 23 is performed. While the top surface of each of the unified conductive pattern 140S and the top surface of each of the plurality of source/drain contact patterns CA are being covered with the deposition inhibition layer, the insulating guide film 160 may be formed to cover the top surfaces of the insulating spacers 120 and the top surface of the inter-gate dielectric film 128. Thereafter, the deposition inhibition layer may be removed to expose the top surface of each of the plurality of unified conductive patterns 140S and the top surface of each of the plurality of source/drain contact patterns CA again. The deposition inhibition layer may be formed using an atomic layer deposition (ALD) process. The deposition inhibition layer may include a material that may be grown on surfaces of the conductive material regions but cannot be grown on surfaces of the insulating material regions. In some example embodiments, the deposition inhibition layer may include a polymer, without being limited thereto.

As a comparative example, when the insulating guide film 160 is formed as described with reference to FIGS. 24A and 24B, conductive material regions exposed together with insulating material regions may include various kinds of materials. In this case, during the formation of the deposition inhibition layer, a non-uniform deposition inhibition layer having a different thickness depending on the type of a material of the conductive material regions may be obtained. For example, a growth rate of the deposition inhibition layer may be relatively high on surfaces of a copper (Cu) film and a cobalt (Co) film, while the growth rate of the deposition inhibition layer may be relatively low on surfaces of a tungsten (W) film, a titanium nitride (TiN) film, and a ruthenium (Ru) film. As described above, when conductive regions including various conductive materials are exposed, a non-uniform deposition inhibition layer may be obtained due to the diversity of the growth environment of the deposition inhibition layer. When the insulating guide film 160 is formed in circumstances described above, selectivity for forming the insulating guide film 160 only on the insulating material regions may deteriorate.

In the method of manufacturing the IC device, according to the disclosed example embodiments, during the formation of the insulating guide film 160, conductive materials exposed together with the insulating material regions may be unified into one type to improve selectivity for selectively forming the insulating guide film 160 only on the insulating material regions. To this end, a material exposed at the top surface of the multilayered conductive film structure 140 exposed at the top surface of the gate line GL may be made the same as a material exposed at the top surface of the source/drain contact pattern CA. Thus, when the insulating guide film 160 is formed, selectivity for forming the insulating guide film 160 only on the insulating material regions may be improved.

Figure 25A:
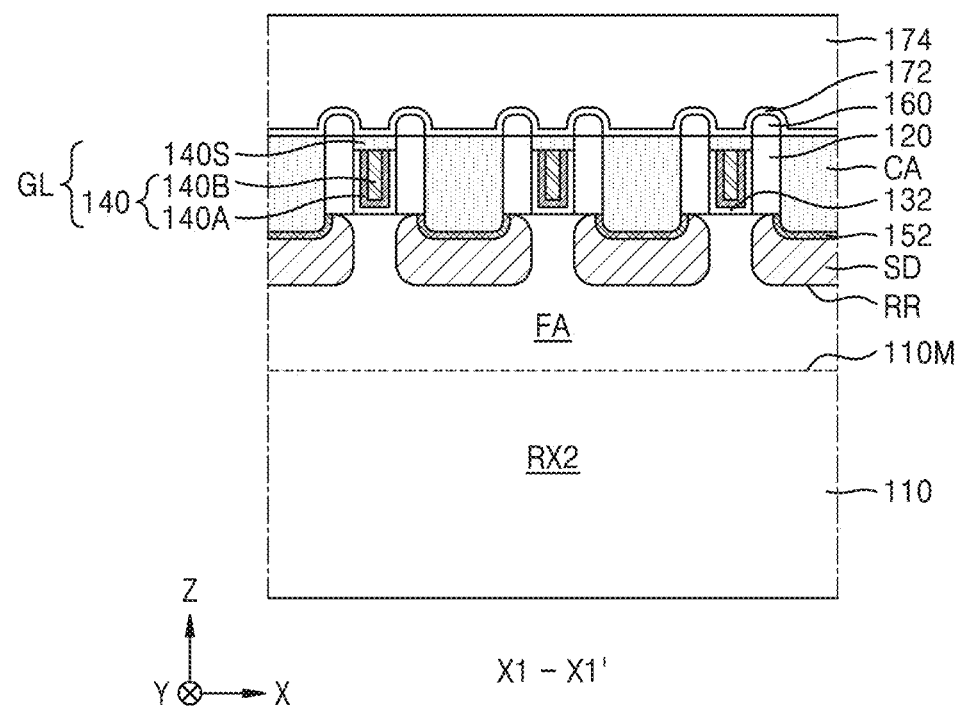
Figure 25B:
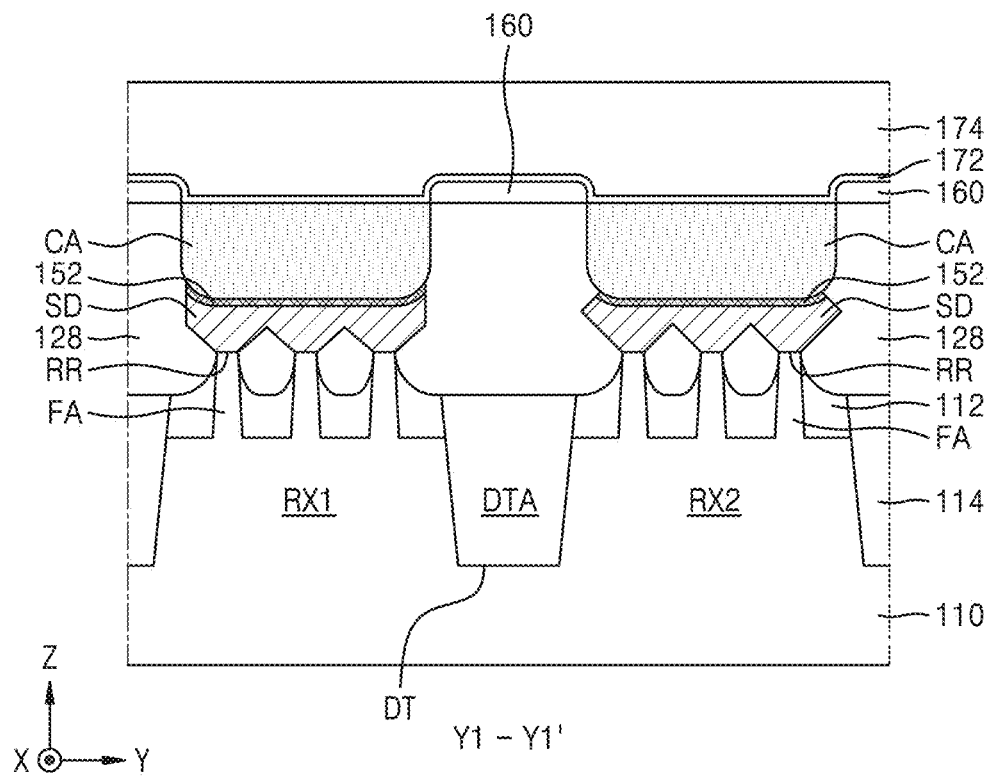

Referring to FIGS. 25A and 25B, an etch stop film 172 and an interlayer insulating film 174 may be sequentially formed on the resultant structure of FIGS. 24A and 24B.

Thereafter, as shown in FIGS. 3A and 3B, a gate contact pattern CB and a via contact pattern CAV may be formed. The gate contact pattern CB may pass through the interlayer insulating film 174 and the etch stop film 172 in the vertical direction (Z direction) and be connected to the gate line GL. The via contact pattern CAV may pass through the interlayer insulating film 174 and the etch stop film 172 in the vertical direction (Z direction) and be connected to the source/drain contact pattern CA.

Although the method of manufacturing the IC device 100 shown in FIGS. 2 and 3A to 3C have been described with reference to FIGS. 11A to 25B, it will be understood that IC devices having various structures may be manufactured by making various modifications and changes with reference to the descriptions of FIGS. 11A to 25B within the scope of the inventive concepts.

Figure 26A:
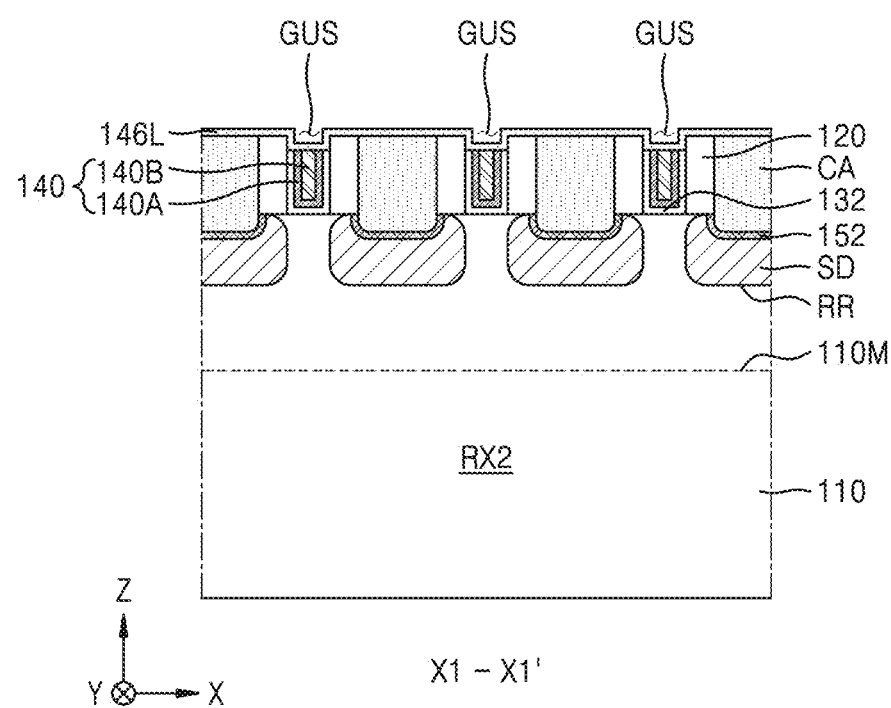
FIGS. 26A and 26B are cross-sectional views of a process sequence of a method of manufacturing an IC device, according to some example embodiments.
Figure 26B:
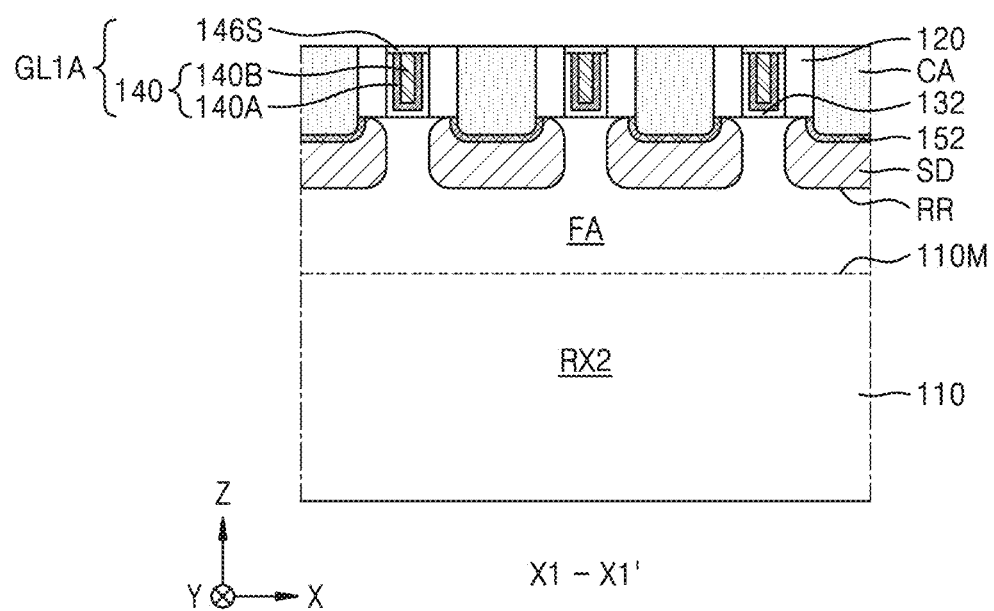

FIGS. 26A and 26B are cross-sectional views of a process sequence of a method of manufacturing an IC device, according to some example embodiments. A sectional configuration of a portion corresponding to the cross-section taken along line X1-X1' of FIG. 2, according to the process sequence, is illustrated in FIGS. 26A and 26B. An example method of manufacturing an IC device having substantially the same structure as that of the IC device 100 shown in FIGS. 2 and 3A to 3C will be described with reference to FIGS. 26A and 26B.

Referring to FIG. 26A, after the processes described with reference to FIGS. 11A to 21 are performed, a unified conductive liner 146L may be formed to conformally cover the exposed top surface of the resultant structure shown in FIG. 21.

After the unified conductive liner 146L is formed, a portion of the gate upper space GUS may remain empty on the unified conductive liner 146L. The unified conductive liner 146L may include a metal film including one metal selected from Ti, Ta, W, Ru, Al, Nb, Mo, Hf, Ni, Co, Pt, Cu, Yb, Tb, Dy, Er, and Pd.

Referring to FIG. 26B, in the resultant structure of FIG. 26A, the resultant structure including the unified conductive liner 146L may be planarized using a CMP process such that a top surface of the unified conductive liner 146L is coplanar with a top surface of the insulating spacers 120. Thus, a unified conductive pattern 146S may be formed to cover a top surface of the multilayered conductive film structure 140. The multilayered conductive film structure 140 and the unified conductive pattern 146S may constitute a gate line GL1A. The unified conductive pattern 146S in the gate line GL1A may have a smaller thickness than the unified conductive pattern 140S in the IC device 100 shown in FIGS. 3A to 3C in a vertical direction (Z direction). Subsequently, the processes described with reference to FIGS. 24A to 25B may be performed on the resultant structure of FIG. 26B.

To manufacture the IC device 200 shown in FIG. 4, a method that is substantially the same as the method of manufacturing the IC device 200, which has been described with reference to FIGS. 11A to 25B, may be used. However, during the process described with reference to FIG. 15, after the gate insulating film 132 is formed inside the plurality of gate spaces GA of the resultant structure of FIG. 14, a multilayered conductive film structure 240 may be formed on the gate insulating film 132 instead of the multilayered conductive film structure 140. The multilayered conductive film structure 240 may include a first metal-containing film 240A, a second metal-containing film 240B, and a third metal-containing film 240C that are sequentially stacked on the gate insulating film 132 and include respectively different materials. Subsequently, processes that are substantially the same as those described with reference to FIGS. 16 to 25B may be performed on the obtained resultant structure, and thus, the IC device 200 shown in FIG. 4 may be manufactured.

Figure 27A:
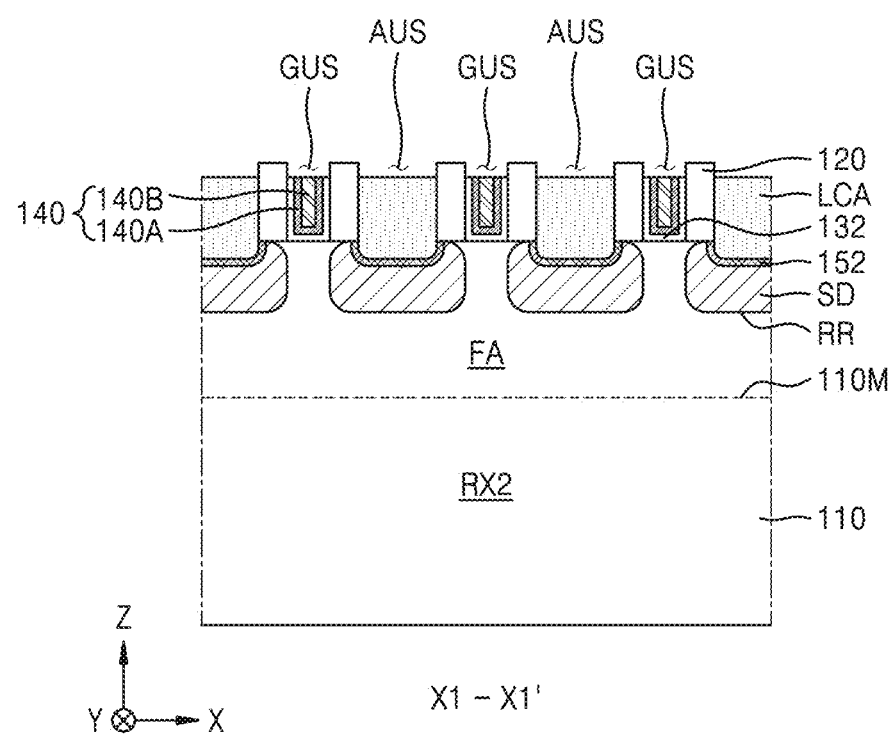
FIGS. 27A to 27C are cross-sectional views of a process sequence of a method of manufacturing an IC device, according to some example embodiments.
Figure 27B:
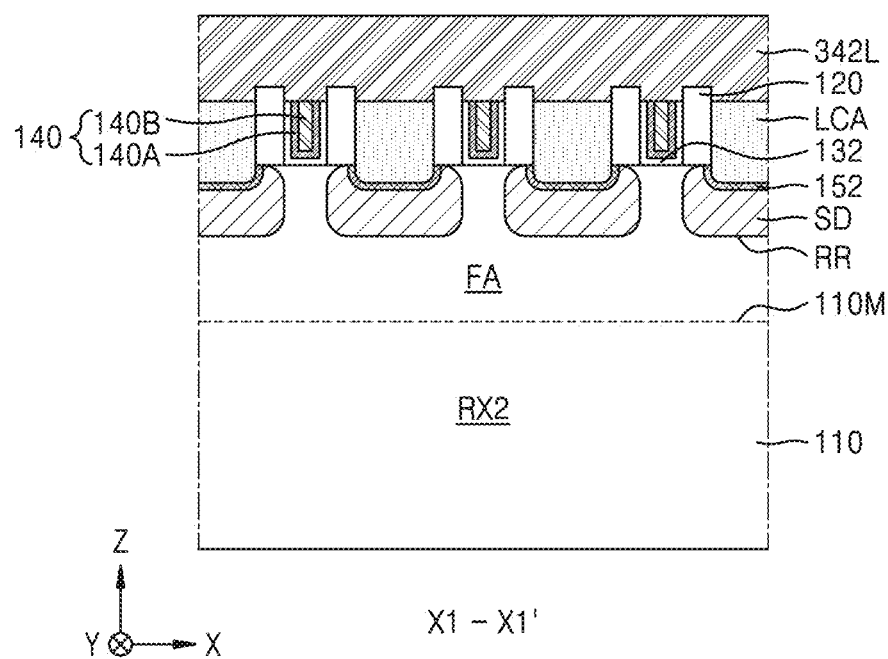
Figure 27C:
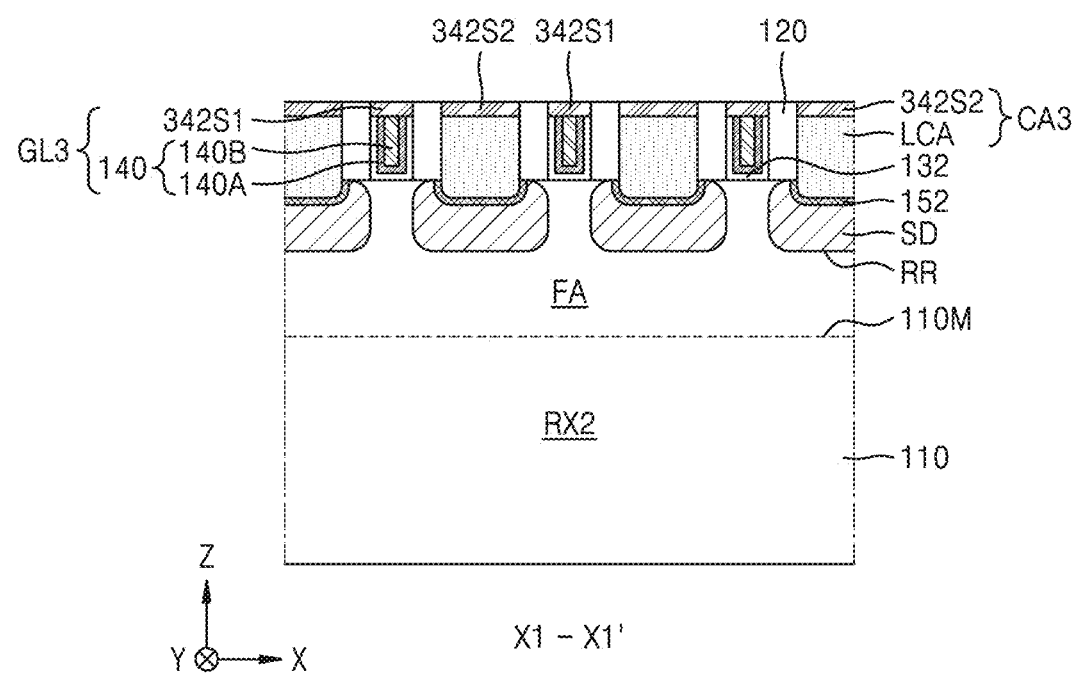

FIGS. 27A to 27C are cross-sectional views of a process sequence of a method of manufacturing an IC device, according to some example embodiments. A sectional configuration of a portion corresponding to the cross-section taken along line X1-X1' of FIG. 2, according to the process sequence, is illustrated in FIGS. 27A to 27C. An example method of manufacturing the IC device 200 shown in FIGS. 5A to 5C will be described with reference to FIGS. 27A to 27C.

Referring to FIG. 27A, the processes described with reference to FIGS. 11A to 20B may be performed. Thereafter, a multilayered conductive film structure 140 exposed in the resultant structure of FIGS. 20A and 20B may be removed by a partial thickness from a top surface thereof. Thus, a gate upper space GUS, of which a width in a first direction (X direction) is defined by insulating spacers 120 on the multilayered conductive film structure 140, may be formed. Also, a source/drain contact pattern CA may be removed by a partial thickness from a top surface thereof. Thus, a contact upper space AUS, of which a width in the first direction (X direction) is defined by the insulating spacers 120 on the source/drain contact pattern CA, may be formed. By forming the contact upper space AUS, the source/drain contact pattern CA may be modified into a lower source/drain contact unit LCA.

Referring to FIG. 27B, a unified conductive film 342L may be formed on the resultant structure of FIG. 27A to such a sufficient thickness to fill the plurality of gate upper spaces GUS and the contact upper space AUS. The unified conductive film 342L may include a metal film including one metal selected from Ti, Ta, W, Ru, Al, Nb, Mo, Hf, Ni, Co, Pt, Cu, Yb, Tb, Dy, Er, and Pd.

Referring to FIG. 27C, the unified conductive film 342L may be planarized using a CMP process so that a top surface of the insulating spacer 120 may be exposed in the resultant structure of FIG. 27B. Thus, a plurality of unified conductive patterns 342S1 and an upper source/drain contact unit 342S2 may be obtained. The plurality of unified conductive patterns 342S1 may be formed to cover the top surface of the multilayered conductive film structure 140 and fill the gate upper space (refer to GUS in FIG. 27A). The upper source/drain contact unit 342S2 may be formed to cover a top surface of the lower source/drain contact unit LCA and fill the contact upper space (refer to AUS in FIG. 27A).

The multilayered conductive film structure 140 and the unified conductive pattern 342S1 may constitute a gate line GL3, and the lower source/drain contact unit LCA and the upper source/drain contact unit 342S2 may constitute a source/drain contact pattern CA3.

Subsequently, the processes described with reference to FIGS. 24A to 25B may be performed on the resultant structure of FIG. 27C, and thus, the IC device 200 shown in FIGS. 5A to 5C may be manufactured.

To manufacture the IC device 400 shown in FIG. 6, a method that is substantially the same as the method of manufacturing the IC device 200, which has been described with reference to FIGS. 11A to 25B and 27A to 27C, may be used. However, during the process described with reference to FIG. 15, after the gate insulating film 132 is formed inside the plurality of gate spaces GA in the resultant structure of FIG. 14, a multilayered conductive film structure 440 may be formed on the gate insulating film 132 instead of the multilayered conductive film structure 140. The multilayered conductive film structure 440 may include a first metal-containing film 440A, a second metal-containing film 440B, and a third metal-containing film 440C (e.g., at least a first conductive pattern including a first material and a second conductive pattern including a second material, and a third conductive pattern including a third material, the first, second, third material being different materials from each other) that are sequentially stacked on the gate insulating film 132 and include different materials, respectively. Subsequently, the process described with reference to FIGS. 16 to 20B and the processes described with reference to FIGS. 27A to 27C may be performed on the obtained resultant structure, and thus, the IC device 400 shown in FIG. 6 may be manufactured.

FIGS. 28A to 28G are cross-sectional views of a process sequence of a method of manufacturing an IC device, according to some example embodiments. A sectional configuration of a portion corresponding to a cross-section taken along line X9-X9' of FIG. 9, according to a process sequence, is illustrated in FIGS. 28A to 28G. An example method of manufacturing the IC device 900 shown in FIGS. 9 and 10, according to an example embodiment, will be described with reference to FIGS. 28A to 28G. In FIGS. 28A to 28G, the same reference numerals are used to denote the same elements as in FIGS. 3A to 25B, and detailed descriptions thereof are omitted.

Figure 28A:
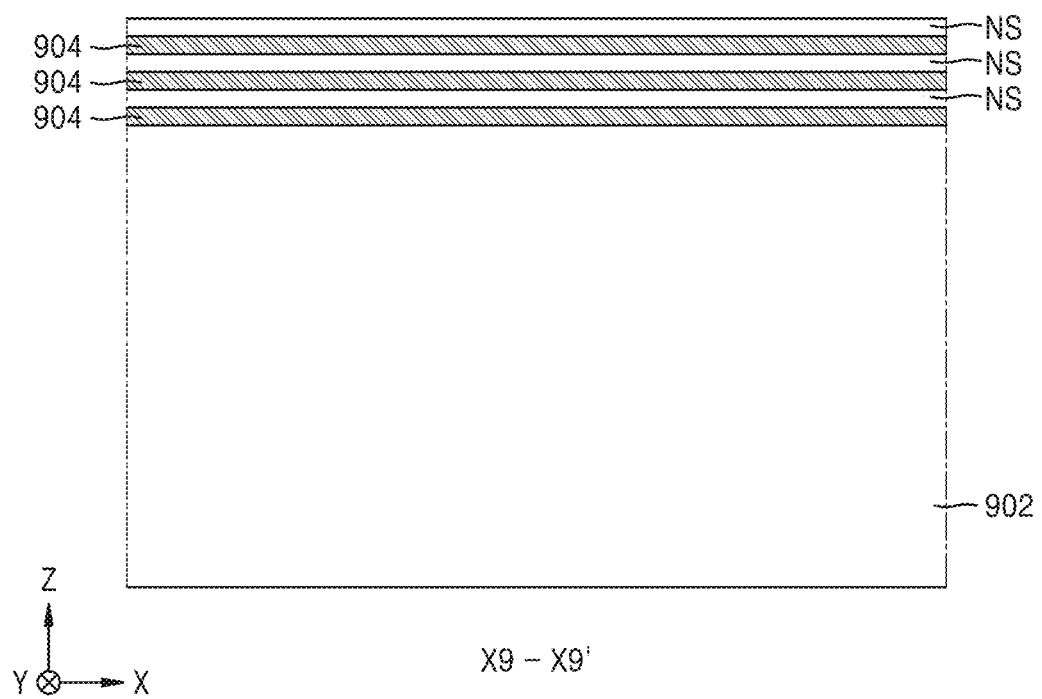
FIGS. 28A to 28G are cross-sectional views of a process sequence of a method of manufacturing an IC device, according to some example embodiments.

Referring to FIG. 28A, a plurality of sacrificial semiconductor layers 904 and a plurality of nanosheet semiconductor layers NS may be alternately stacked one by one on a substrate 902. The plurality of sacrificial semiconductor layers 904 may include a different semiconductor material from the plurality of nanosheet semiconductor layers NS. In some example embodiments, the plurality of sacrificial semiconductor layers 904 may include SiGe, and the plurality of nanosheet semiconductor layers NS may include Si.

Figure 28B:
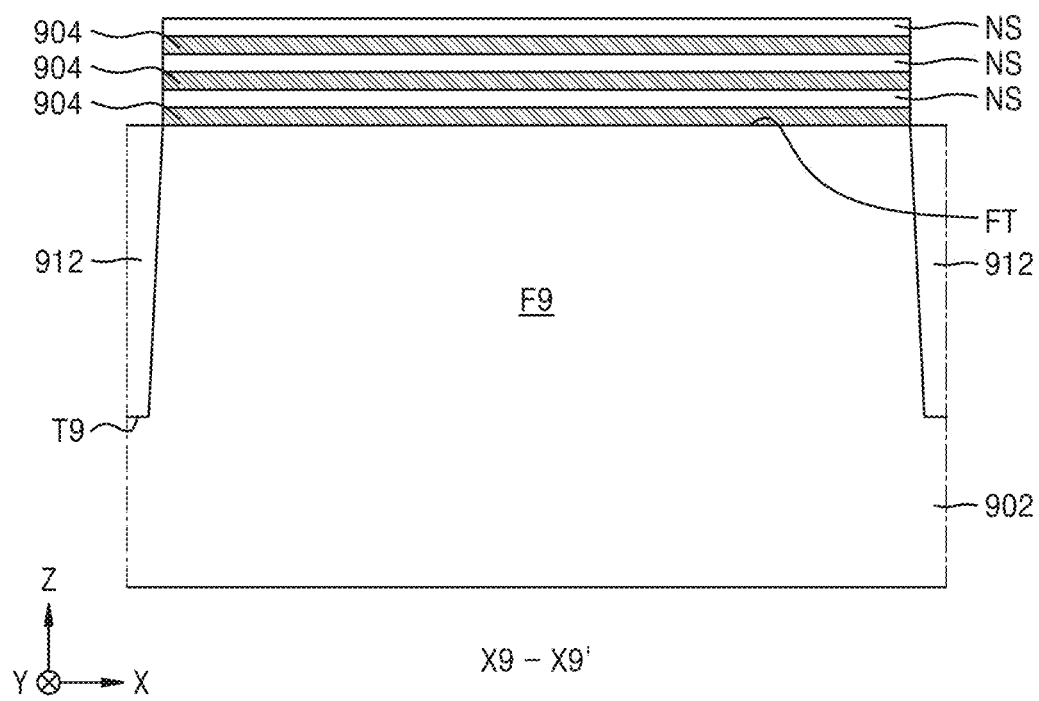

Referring to FIG. 28B, a trench T9 may be formed by etching portions of the plurality of sacrificial semiconductor layers 904, the plurality of nanosheet semiconductor layers NS, and the substrate 902, and a device isolation film 912 may be formed inside the trench T9. Thus, a fin-type active region F9 may be defined by the trench T9. A stack structure of the plurality of sacrificial semiconductor layers 904 and the plurality of nanosheet semiconductor layers NS may remain on a top surface FT of the fin-type active region F9.

Figure 28C:
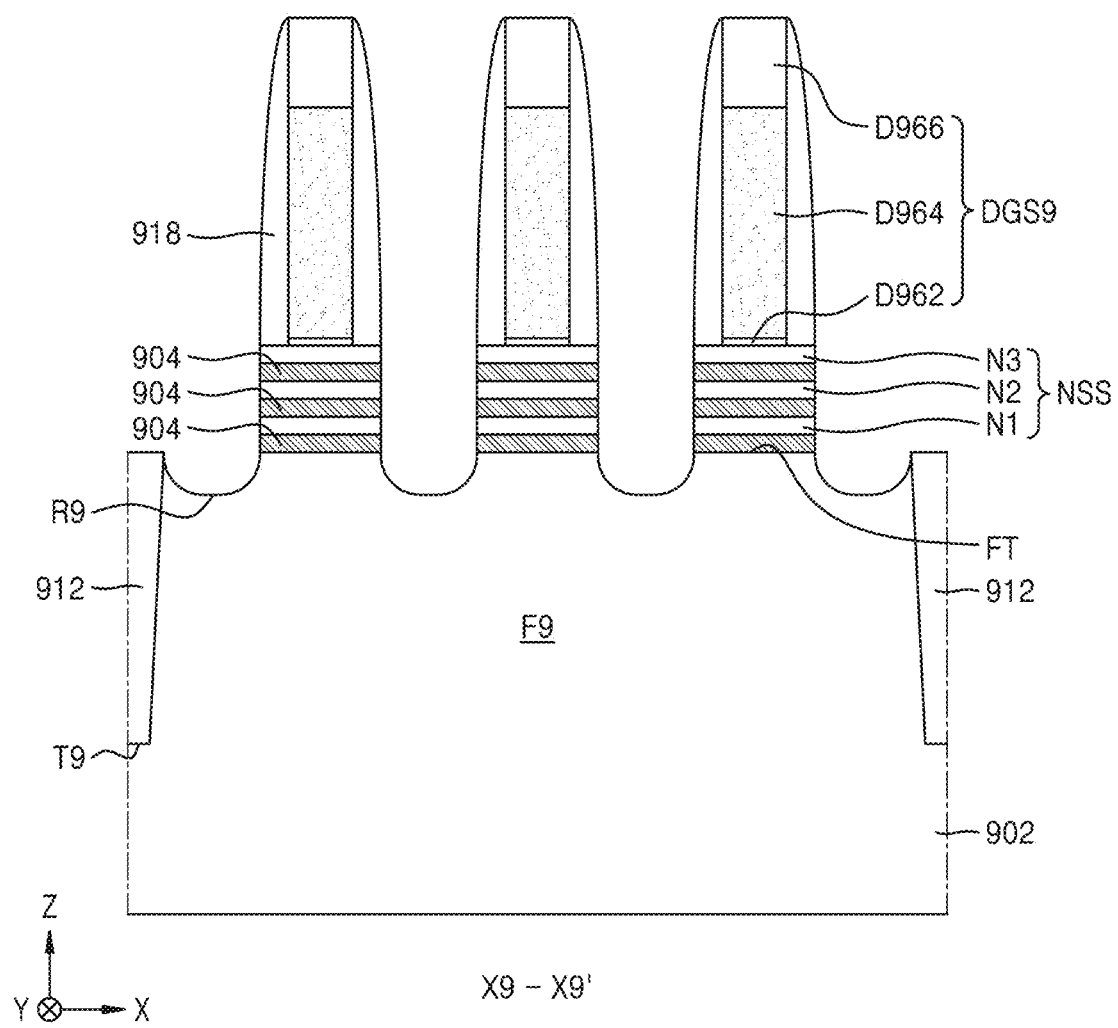

Referring to FIG. 28C, in the resultant structure of FIG. 28B, a plurality of dummy gate structures DGS9 may be formed on the stack structure of the plurality of sacrificial semiconductor layers 904 and the plurality of nanosheet semiconductor layers NS, and a plurality of outer insulating spacers 918 may be formed to cover both sidewalls of each of the plurality of dummy gate structures DGS9.

Afterwards, portions of the plurality of sacrificial semiconductor layers 904 and the plurality of nanosheet semiconductor layers NS may be respectively etched using the plurality of dummy gate structures DGS9 and the plurality of outer insulating spacers 918 as etch masks. Thus, the plurality of nanosheet semiconductor layers NS may be divided into a plurality of nanosheet stacks NSS including a plurality of nanosheets (e.g., first to third nanosheets N1, N2, and N3). Thereafter, the fin-type active region F9 exposed between the plurality of nanosheet stacks NSS may be etched, and thus a plurality of recess regions R9 may be formed in an upper portion of the fin-type active region F9.

Each of the plurality of dummy gate structures DGS9 may elongate in a second direction (Y direction). Each of the plurality of dummy gate structures DGS9 may have a structure in which an insulating layer D962, a dummy gate layer D964, and a capping layer D966 are sequentially stacked. In some example embodiments, the insulating layer D962 may include silicon oxide, the dummy gate layer D964 may include polysilicon, and the capping layer D966 may include silicon nitride.

Figure 28D:
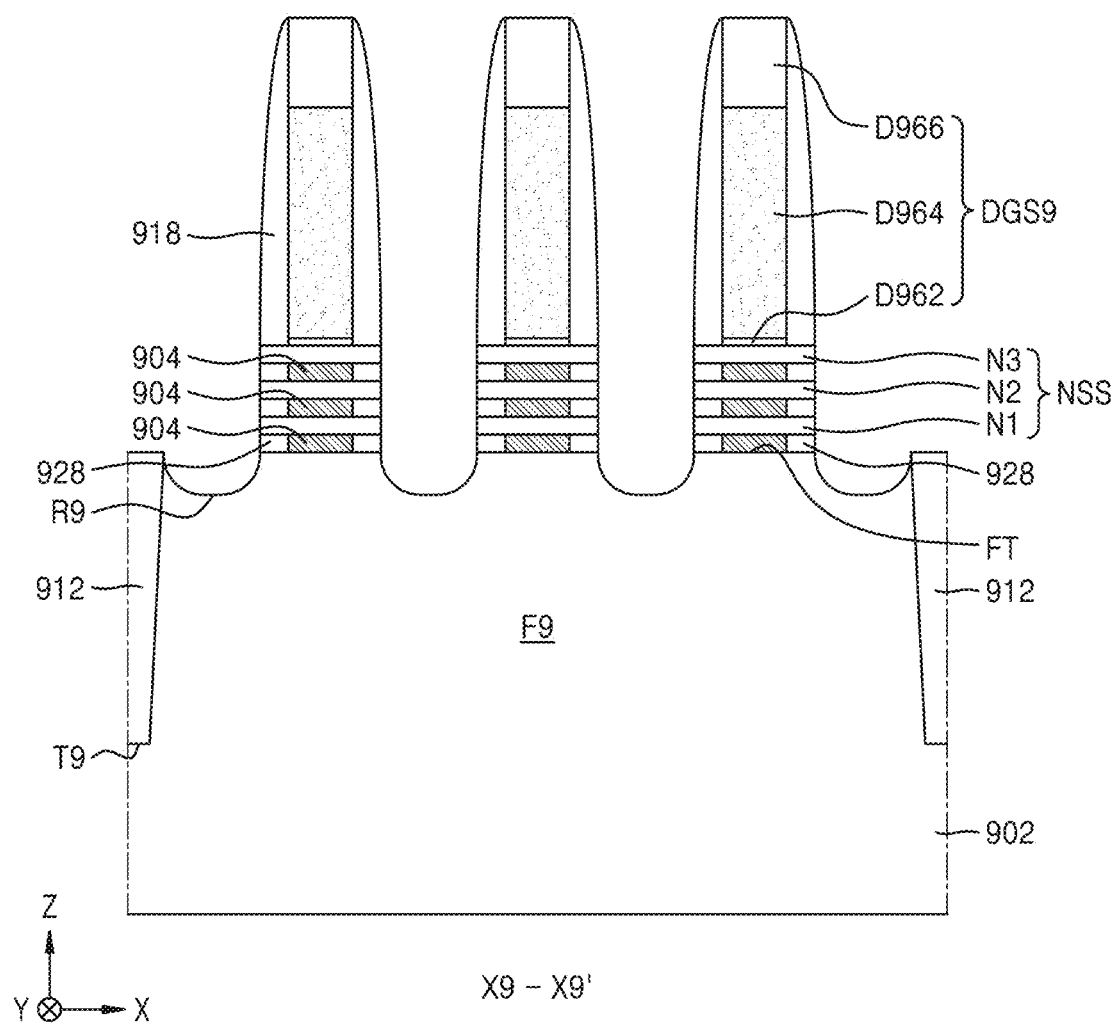

Referring to FIG. 28D, respective portions of the plurality of sacrificial semiconductor layers 904 exposed around the plurality of recess regions R4 may be removed from the resultant structure of FIG. 28C, and thus, a plurality of indent regions may be formed between the first to third nanosheets N1, N2, and N3 and between the first nanosheet N1 and the top surface FT. Thereafter, a plurality of inner insulating spacers 928 may be formed to fill the plurality of indent regions.

Figure 28E:
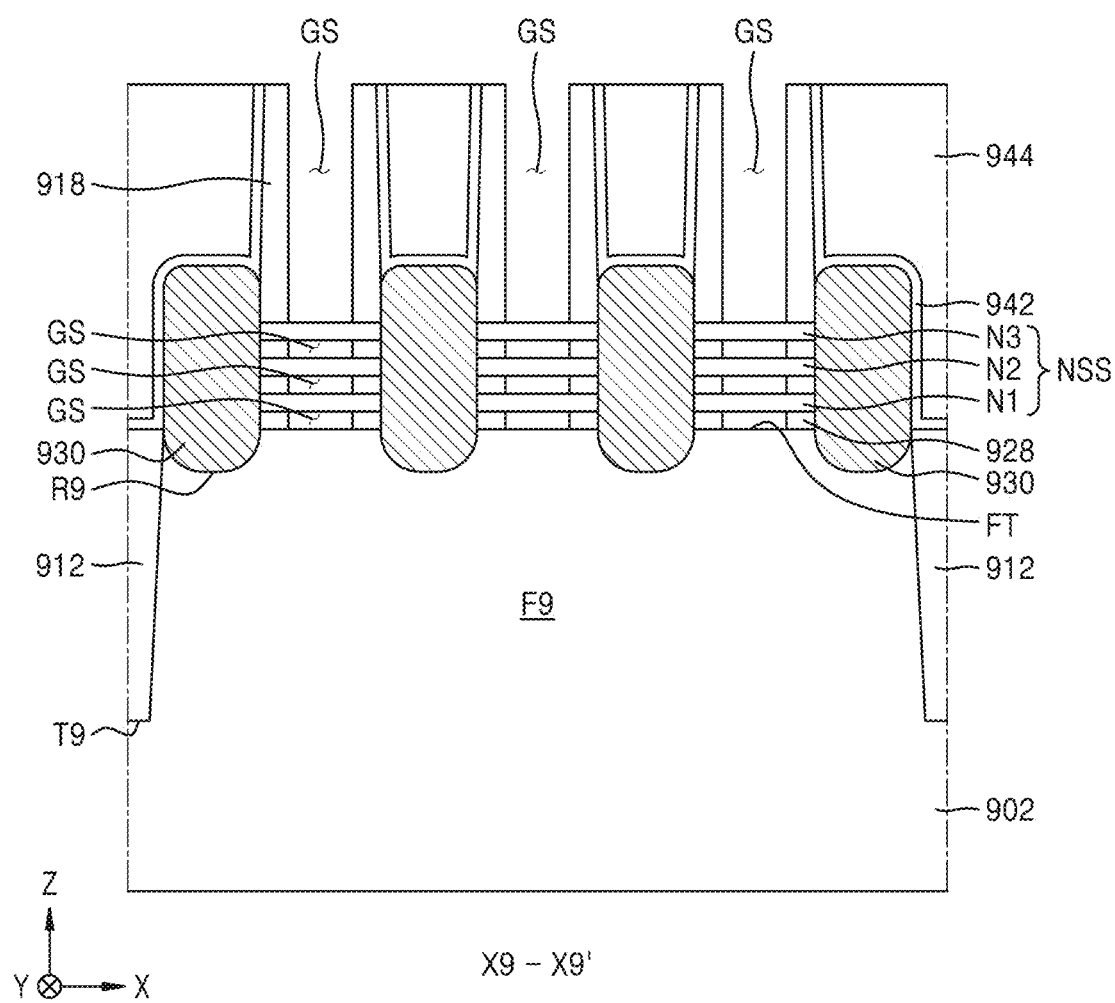

Referring to FIG. 28E, in the resultant structure of FIG. 28D, a semiconductor material may be epitaxially grown on exposed surfaces of the plurality of recess regions R9 to form a plurality of source/drain regions 930. An insulating liner 942 may be formed to cover the resultant structure including the plurality of source/drain regions 930, and an inter-gate dielectric film 944 may be formed on the insulating liner 942. Thereafter, a top surface of each of the insulating liner 942 and the inter-gate dielectric film 944 may be planarized to expose a top surface of the capping layer D966, and the plurality of dummy gate structures DGS9 may be then removed to provide gate spaces GS. Afterwards, the plurality of sacrificial semiconductor layers 904 may be removed through the gate spaces GS, and thus, the gate spaces GS may expand into respective spaces between the first to third nanosheets N1, N2, and N3 and a space between the first nanosheet N1 and the top surface FT.

Figure 28F:
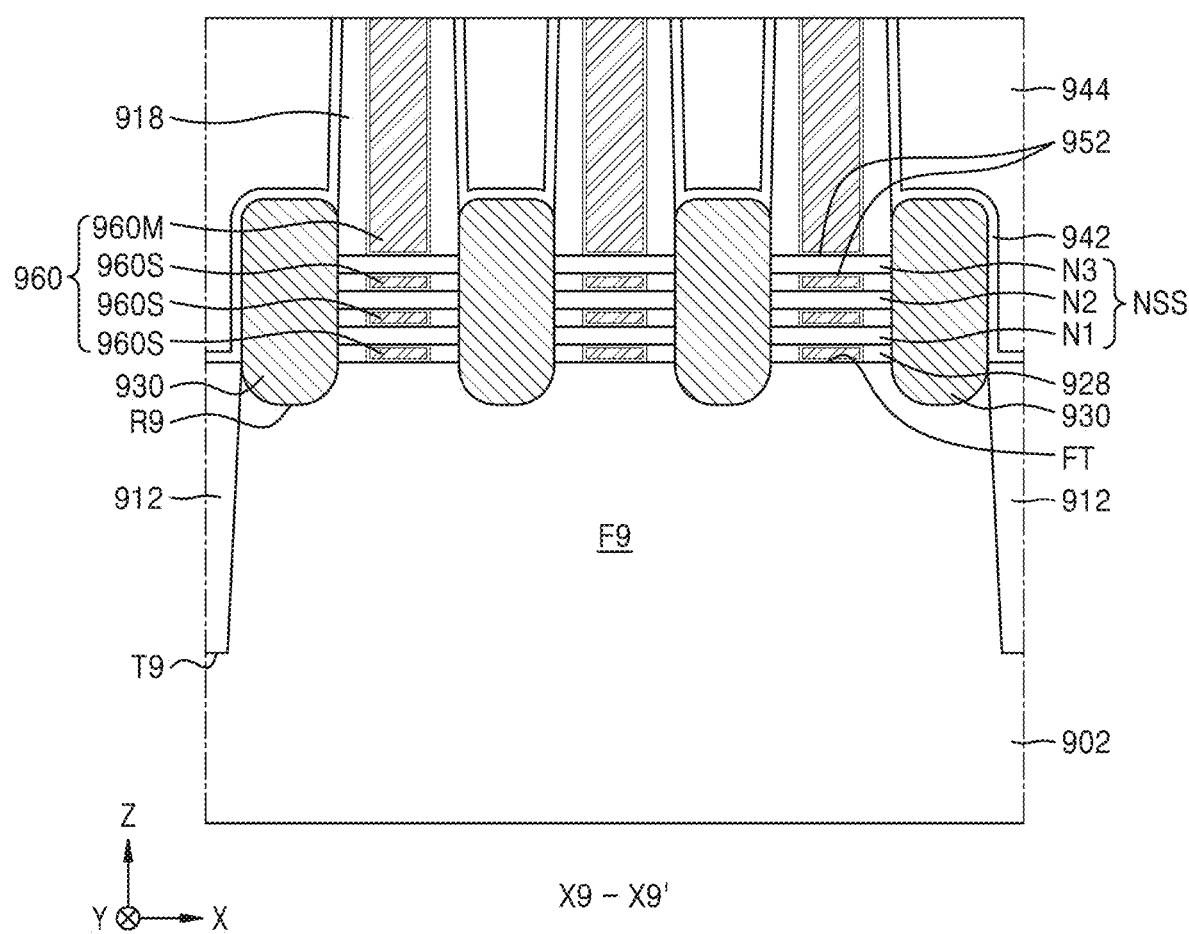

Referring to FIG. 28F, a gate insulating film 952 may be formed to cover exposed surfaces of the plurality of nanosheets N1, N2, and N3 and the fin-type active region F9, and a plurality of multilayered conductive film structures 960 may be formed on the gate insulating film 952 to fill the gate spaces GS.

Each of the plurality of multilayered conductive film structures 960 may include a main gate portion 960M and a plurality of sub-gate portions 960S. The main gate portion 960M may cover a top surface of the nanosheet stack NSS and elongate in a second direction (Y direction). The plurality of sub-gate portions 960S may be integrally connected to the main gate portion 960M and respectively arranged one by one between the first to third nanosheets N1, N2, and N3 and between the fin-type active region F9 and the first nanosheet N1. The plurality of multilayered conductive film structures 960 may include a plurality of films, each of which is selected from titanium nitride (TiN), tantalum nitride (TaN), titanium aluminium carbide (TiAlC), titanium aluminium nitride (TiAlN), titanium silicon nitride (TiNSi), tantalum silicon nitride (TaNSi), tungsten (W), aluminium (Al), or a combination thereof. In some example embodiments, the main gate portion 960M of each of the plurality of multilayered conductive film structures 960 may have the multilayered conductive film structure 140 described with reference to FIGS. 3A and 3B, or the multilayered conductive film structure 240 described with reference to FIG. 4.

Figure 28G:
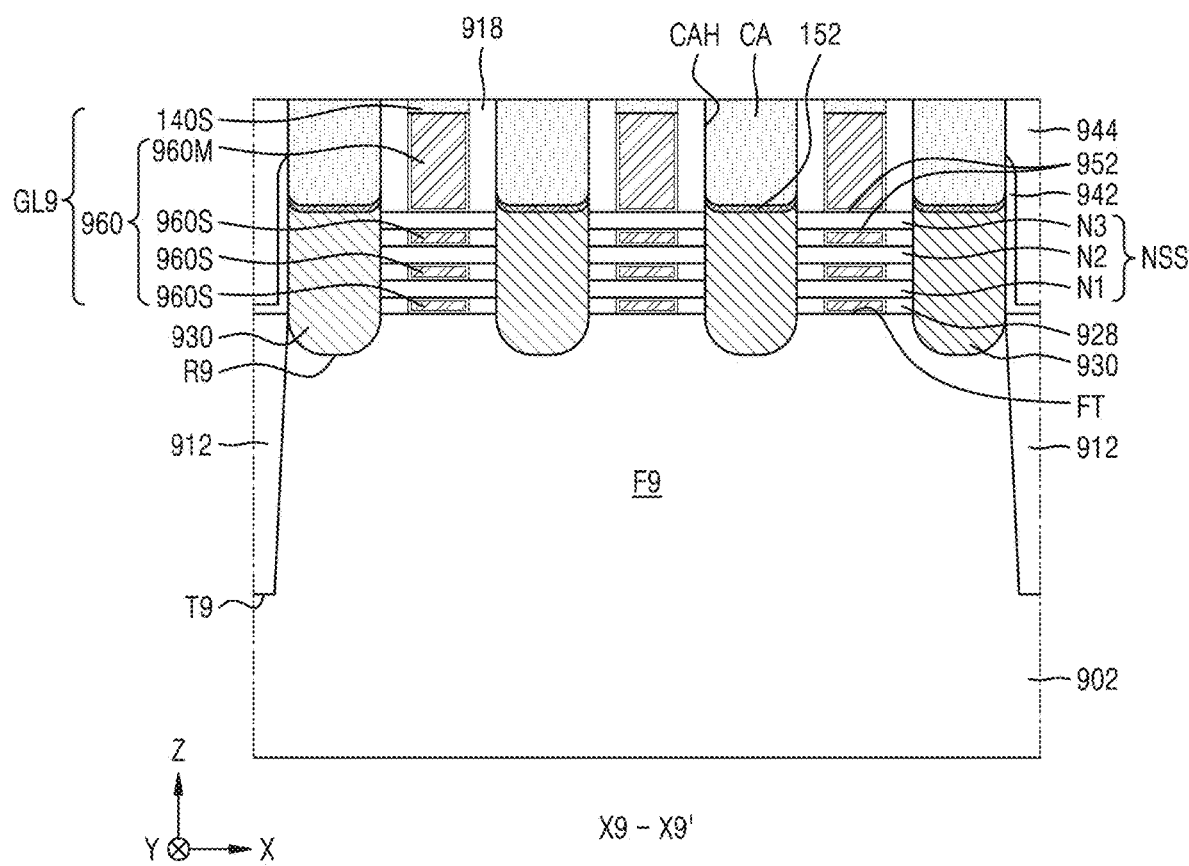

Referring to FIG. 28G, processes that are substantially the same as those described with reference to FIGS. 16 to 20B may be performed on the resultant structure of FIG. 28F. Thus, a plurality of source/drain contact holes CAH may be formed to pass through the insulating liner 942 and the inter-gate dielectric film 944 in a vertical direction (Z direction). A metal silicide film 152 may be formed to cover the source/drain region 930 exposed at a bottom unit of each of the plurality of source/drain contact holes CAH. A plurality of source/drain contact patterns CA may be formed on the metal silicide film 152 to fill the plurality of source/drain contact holes CAH.

Thereafter, a gate upper gate may be formed by removing the multilayered conductive film structure 240 by a partial thickness from a top surface thereof using a method that is substantially the same as that described with reference to FIGS. 21 to 23. Afterwards, the gate upper space may be filled with a unified conductive pattern 140S. The multilayered conductive film structure 960 and the unified conductive pattern 140S may constitute the gate line GL9.

Subsequently, processes that are substantially the same as those described with reference to FIGS. 24A to 25B may be performed, and thus, the IC device 900 shown in FIGS. 9 and 10 may be manufactured.

While the inventive concepts have been particularly shown and described with reference to some example embodiments thereof, it will be understood that various changes in form and details may be made therein without departing from the spirit and scope of the following claims.

What is claimed is:

1. An integrated circuit device comprising:
   a fin-type active region extending on a substrate in a first direction;
   a gate line extending on the fin-type active region in a second direction, the gate line having a first uppermost surface at a first vertical level, the second direction intersecting with the first direction;
   an insulating spacer covering a sidewall of the gate line, the insulating spacer having a second uppermost surface at the first vertical level;
   a source/drain region adjacent to the gate line on the fin-type active region;
   a source/drain contact pattern connected to the source/drain region, the source/drain contact pattern having a third uppermost surface at the first vertical level; and
   an insulating guide film comprising a first portion covering the second uppermost surface of the insulating spacer,
   wherein the gate line comprises
      a multilayered conductive film structure including a plurality of conductive patterns and having a top surface defined by the plurality of conductive patterns, the plurality of conductive patterns comprising at least a first conductive pattern including at least a first material and a second conductive pattern including a second material different from the first material, and
      a unified conductive pattern in contact with a top surface of each of the plurality of conductive patterns in the multilayered conductive film structure, the unified conductive pattern having a top surface that defines the first uppermost surface of the gate line, the unified conductive pattern comprising a same material as the source/drain contact pattern.

2. The integrated circuit device of claim 1, further comprising:
   an inter-gate dielectric film on the substrate, the inter-gate dielectric film surrounding the source/drain contact pattern,
   wherein the insulating guide film further comprises a second portion covering an uppermost surface of the inter-gate dielectric film.

3. The integrated circuit device of claim 1, further comprising:
   a gate contact pattern having a bottom surface in contact with the first uppermost surface of the gate line, wherein a lower portion of the gate contact pattern is self-aligned by the insulating guide film.

4. The integrated circuit device of claim 1, wherein the source/drain contact pattern comprises,
a lower source/drain contact part having a fourth uppermost surface at a second vertical level, wherein the second vertical level is closer to the substrate than the first vertical level, and
an upper source/drain contact part having a bottom surface in contact with the fourth uppermost surface of the lower source/drain contact part and having the third uppermost surface, the upper source/drain contact part and the unified conductive pattern comprising a same material.

5. The integrated circuit device of claim 4, wherein the lower source/drain contact part and the upper source/drain contact part comprise different metals.

6. The integrated circuit device of claim 4, further comprising:
a gate contact pattern having a bottom surface in contact with the first uppermost surface of the gate line; and
a via contact pattern in contact with the third uppermost surface of the upper source/drain contact part.

7. The integrated circuit device of claim 1, further comprising:
an etch stop film conformally covering the insulating guide film;
an interlayer insulating film covering the etch stop film; and
a gate contact pattern passing the interlayer insulating film and the etch stop film in a vertical direction, the gate contact pattern self-aligned by the insulating guide film and the etch stop film and having a bottom surface in contact with the unified conductive pattern.

8. The integrated circuit device of claim 1, further comprising:
an etch stop film conformally covering the insulating guide film;
an interlayer insulating film covering the etch stop film; and
a via contact pattern passing through the interlayer insulating film and the etch stop film in a vertical direction, the via contact pattern self-aligned by the insulating guide film and the etch stop film and having a bottom surface in contact with the source/drain contact pattern.

9. An integrated circuit device comprising:
a fin-type active region extending on a substrate in a first direction;
a plurality of gate lines extending on the fin-type active region in a second direction, each of the plurality of gate lines having a first uppermost surface at a first vertical level, the second direction intersecting with the first direction;
a plurality of insulating spacers covering both sidewalls of each of the plurality of gate lines, respectively, each of the plurality of insulating spacers having a second uppermost surface at the first vertical level;
a plurality of source/drain regions on the fin-type active region, the plurality of source/drain regions being arranged one by one between adjacent pairs of the plurality of gate lines, respectively;
a source/drain contact pattern connected to a selected one of the plurality of source/drain regions, the source/drain contact pattern having a third uppermost surface at the first vertical level; and
an insulating guide film covering the second uppermost surface of each of the plurality of insulating spacers,
wherein each of the plurality of gate lines comprises
a multilayered conductive film structure includes a plurality of conductive patterns, has a top surface defined by the plurality of conductive patterns, at least one of the plurality of conductive patterns comprising a different material from another one of the plurality of conductive patterns, and
a unified conductive pattern in contact with a top surface of each of the plurality of conductive patterns in the multilayered conductive film structure, the unified conductive pattern having a top surface that defines the first uppermost surface.

10. The integrated circuit device of claim 9, wherein the unified conductive pattern comprises a same material as the source/drain contact pattern.

11. The integrated circuit device of claim 9, wherein
in each of the plurality of gate lines, the plurality of conductive patterns comprise a first metal-containing film and a second metal-containing film, the first metal-containing film and the second metal-containing film sequentially stacked on the fin-type active region and comprising different materials, respectively, and
an uppermost surface of each of the first metal-containing film and the second metal-containing film is in contact with a bottom surface of the unified conductive pattern.

12. The integrated circuit device of claim 9, wherein
in each of the plurality of gate lines, the plurality of conductive patterns comprise a first metal-containing film, a second metal-containing film, and a third metal-containing film, the first metal-containing film, the second metal-containing film, the third metal-containing film sequentially stacked on the fin-type active region and comprising different materials, respectively, and
an uppermost surface of each of the first metal-containing film, the second metal-containing film, and the third metal-containing film is in contact with a bottom surface of the unified conductive pattern.

13. The integrated circuit device of claim 9, further comprising:
a metal silicide film between the selected one of the plurality of source/drain regions and the source/drain contact pattern,
wherein the source/drain contact pattern comprises a metal-containing film having a bottom surface in contact with the metal silicide film and the third uppermost surface at the first vertical level, and
the unified conductive pattern in each of the plurality of gate lines comprises a same material as the metal-containing film.

14. The integrated circuit device of claim 9, further comprising:
a metal silicide film between the selected one of the plurality of source/drain regions and the source/drain contact pattern,
wherein the source/drain contact pattern comprises,
a lower source/drain contact part having a bottom surface in contact with the metal silicide film and a fourth uppermost surface at a second vertical level, wherein the second vertical level is closer to the substrate than the first vertical level, and
an upper source/drain contact part having a bottom surface in contact with the fourth uppermost surface of the lower source/drain contact part and having the third uppermost surface at the first vertical level, the upper source/drain contact part comprising a same material as a constituent material of the unified conductive pattern.

15. The integrated circuit device of claim 14, wherein the lower source/drain contact part comprises a different material from the upper source/drain contact part.

16. The integrated circuit device of claim 14, wherein the lower source/drain contact part comprises a same material as the upper source/drain contact part.

17. An integrated circuit device comprising:
- a fin-type active region extending on a substrate in a first direction;
- a gate line extending on the fin-type active region in a second direction, the gate line comprising a multilayered conductive film structure and a unified conductive pattern, the multilayered conductive film structure comprising a plurality of conductive patterns, the plurality of conductive patterns comprising at least two conductive patterns, the at least two conductive patterns including different materials, respectively, the unified conductive pattern being in contact with a top surface of each of the plurality of conductive patterns, the second direction intersecting with the first direction;
- an insulating spacer covering a sidewall of the gate line;
- a source/drain region adjacent to the gate line on the fin-type active region;
- a metal silicide film covering the source/drain region;
- a source/drain contact pattern connected to the source/drain region through the metal silicide film, the source/drain contact pattern being apart from the gate line in the first direction with the insulating spacer therebetween; and
- an insulating guide film covering a top surface of the insulating spacer,
- wherein each of a first uppermost surface of the unified conductive pattern, a second uppermost surface of the insulating spacer, and a third uppermost surface of the source/drain contact pattern extend parallel to a main surface of the substrate at a first vertical level on the substrate, and the unified conductive pattern comprises a same material as the source/drain contact pattern.

18. The integrated circuit device of claim 17, wherein
- each of the plurality of conductive patterns comprises a metal film, a metal nitride film, or an alloy film, the metal film, the metal nitride film, or the alloy film comprising at least one of titanium (Ti), tantalum (Ta), tungsten (W), ruthenium (Ru), aluminium (Al), niobium (Nb), molybdenum (Mo), hafnium (Hf), nickel (Ni), cobalt (Co), platinum (Pt), copper (Cu), ytterbium (Yb), terbium (Tb), dysprosium (Dy), erbium (Er), or palladium (Pd), and
- each of the unified conductive pattern and the source/drain contact pattern comprises a metal film comprising at least one of titanium (Ti), tantalum (Ta), tungsten (W), ruthenium (Ru), aluminium (Al), niobium (Nb), molybdenum (Mo), hafnium (Hf), nickel (Ni), cobalt (Co), platinum (Pt), copper (Cu), ytterbium (Yb), terbium (Tb), dysprosium (Dy), erbium (Er), or palladium (Pd).

19. The integrated circuit device of claim 17, further comprising:
- an etch stop film conformally covering a surface of the insulating guide film;
- an interlayer insulating film covering the etch stop film;
- a gate contact pattern passing through the interlayer insulating film and the etch stop film in a vertical direction, the gate contact pattern self-aligned by the insulating guide film and the etch stop film, the gate contact pattern having a bottom surface in contact with the unified conductive pattern; and
- a via contact pattern passing through the interlayer insulating film and the etch stop film in the vertical direction, the via contact pattern having a bottom surface in contact with the source/drain contact pattern.

* * * * *